US010777353B2

United States Patent
Ando et al.

(10) Patent No.: US 10,777,353 B2
(45) Date of Patent: Sep. 15, 2020

(54) METHOD OF MANUFACTURING ELECTRONIC DEVICE AND THE SAME

(71) Applicant: TDK CORPORATION, Tokyo (JP)

(72) Inventors: Norihisa Ando, Tokyo (JP); Kenichi Inoue, Tokyo (JP); Sunao Masuda, Tokyo (JP); Masahiro Mori, Tokyo (JP); Kayou Matsunaga, Yurihonjo (JP); Kosuke Yazawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/121,719

(22) Filed: Sep. 5, 2018

(65) Prior Publication Data

US 2019/0080841 A1    Mar. 14, 2019

(30) Foreign Application Priority Data

Sep. 11, 2017  (JP) .................................. 2017-174278

(51) Int. Cl.
| | |
|---|---|
| H01G 2/06 | (2006.01) |
| H01G 4/232 | (2006.01) |
| H01G 4/01 | (2006.01) |
| H01G 4/30 | (2006.01) |
| H01G 4/38 | (2006.01) |
| H05K 3/34 | (2006.01) |
| H01G 4/248 | (2006.01) |
| H01G 4/12 | (2006.01) |

(52) U.S. Cl.
CPC ............... *H01G 2/065* (2013.01); *H01G 4/01* (2013.01); *H01G 4/232* (2013.01); *H01G 4/248* (2013.01); *H01G 4/30* (2013.01); *H01G 4/38* (2013.01); *H05K 3/341* (2013.01); *H01G 4/12* (2013.01); *H05K 2201/10431* (2013.01)

(58) Field of Classification Search
None
See application file for complete search history.

(56) References Cited

U.S. PATENT DOCUMENTS

| | | | | |
|---|---|---|---|---|
| 6,046,902 | A * | 4/2000 | Nakagawa ............. | H01G 4/228 361/306.1 |
| 6,181,544 | B1 * | 1/2001 | Nakagawa ............. | H01G 4/228 361/306.1 |
| 6,288,887 | B1 | 9/2001 | Yoshida et al. | |
| 8,570,708 | B2 * | 10/2013 | Itagaki ..................... | H01G 4/30 361/301.4 |
| 10,056,320 | B2 * | 8/2018 | Murrell .................. | H01G 4/232 |
| 2007/0228557 | A1 * | 10/2007 | Onodera ................ | H01C 1/148 257/734 |

(Continued)

FOREIGN PATENT DOCUMENTS

| | | |
|---|---|---|
| JP | 2000-235932 A | 8/2000 |
| JP | 2002-280274 A | 9/2002 |

*Primary Examiner* — Dion Ferguson
(74) *Attorney, Agent, or Firm* — Oliff PLC

(57) ABSTRACT

A method of manufacturing an electronic device includes preparing a chip component with a terminal electrode. A terminal plate is prepared. A connection member is placed between an end surface of the terminal electrode and an inner surface of the terminal plate. The terminal plate and the terminal electrode are joined using the connection member by bringing a press head into contact with an outer surface of the terminal plate and pressing and heating the terminal plate against the terminal electrode.

8 Claims, 19 Drawing Sheets

(56) References Cited

U.S. PATENT DOCUMENTS

| | | | |
|---|---|---|---|
| 2014/0055910 A1* | 2/2014 | Masuda | H01G 4/01 |
| | | | 361/303 |
| 2014/0118882 A1* | 5/2014 | Masuda | H01G 4/2325 |
| | | | 361/321.2 |
| 2014/0345927 A1* | 11/2014 | Itagaki | H01G 2/065 |
| | | | 174/260 |
| 2015/0054388 A1 | 2/2015 | Itagaki et al. | |
| 2017/0287645 A1* | 10/2017 | Masuda | H01G 4/005 |
| 2018/0033556 A1* | 2/2018 | Itamochi | H01C 7/008 |

\* cited by examiner

METHOD OF MANUFACTURING ELECTRONIC DEVICE AND THE SAME

BACKGROUND OF THE INVENTION

1. Field of the Invention

The present invention relates to a method of manufacturing an electronic device and the same.

2. Description of the Related Art

In addition to a normal chip component that is solely directly mounted on a board, as shown in Patent Document 1 for example, a chip component attached with a terminal plate is proposed as an electronic device, such as a ceramic capacitor.

It is reported that the electronic device attached with a terminal plate after being mounted has a reduction effect on a deformation stress that travels from a board to a chip component and a protection effect on a chip component from impacts or so. Thus, the electronic device attached with a terminal plate is used in a field where durability, reliability, and the like are required.

To manufacture a conventional electronic device with a terminal plate, a chip component and a terminal plate are normally put into a reflow furnace and heated so as to be joined by solder.

If a chip component and a terminal plate are entirely subjected to a heat treatment in a reflow furnace, however, the apparatus becomes large-scale, and manufacturing cost increases. When a large number of chip components is simultaneously subjected to a heat treatment in a reflow furnace, heat may not sufficiently reach a solder application region, and the joint may become insufficient, depending on arrangement of the chip components.

When chip components are subjected to a heat treatment and soldered in a reflow furnace, the amount of solder application for each chip component tends to be large so as to prevent solder joint failures or so. If the amount of solder application is large and causes a large joint area between a chip component and a terminal plate, vibration is easy to travel from the chip component to a board or so, and a so-called acoustic noise phenomenon may be generated.

Patent Document 1: JP 2000-235932 A

SUMMARY OF THE INVENTION

The present invention has been achieved under such circumstances. It is an object of the invention to provide a method of manufacturing an electronic device with low cost capable of definitely connecting a terminal plate and a chip component and having less acoustic noise phenomenon, and to provide an electronic device manufactured by the method.

To achieve the above object, a method of manufacturing an electronic device according to the present invention comprises the steps of:
preparing a chip component with a terminal electrode;
preparing a terminal plate;
placing a connection member between an end surface of the terminal electrode and an inner surface of the terminal plate; and
joining the terminal plate and the terminal electrode using the connection member by bringing a press head into contact with an outer surface of the terminal plate and pressing and heating the terminal plate against the terminal electrode.

The method according to the present invention does not use a reflow furnace, and the apparatus thereby does not become large-scale, which contributes to a reduction in manufacturing cost. In the method according to the present invention, the press head contacts with the outer surface of the terminal plate and presses and heats the terminal plate against the terminal electrode, and the terminal plate and the terminal electrode are thereby joined using the connection member. Thus, heat can definitely be added to an application region of the connection member, and the terminal plate and the terminal electrode of the chip component can thereby definitely be connected with an excellent connection strength.

Even if an application amount of the connection member is small, the terminal plate and the terminal electrode of the chip component can definitely be connected with a small connection area. Thus, a vibration from the chip component is hard to reach a board or so, and a so-called acoustic noise can be prevented.

In the method according to the present invention, the press head does not contact with the terminal plate on the side of the mounting surface and does not deteriorate a tin plating or so on the surface of the terminal plate on the side of the mounting surface. Thus, the terminal plate on the side of the mounting board is favorably joined with a solder for mounting, and mounting failures or so can be reduced.

Preferably, the outer surface of the terminal plate has a region where the press head does not contact. In the structure, the terminal plate can easily be joined with the terminal electrode of the chip component within a limited area.

Preferably, the terminal plate comprises a terminal body disposed correspondingly with the end surface of the terminal electrode of the chip component, and a mount portion continuously formed from the terminal body and used for connection with a mounting surface. Preferably, the connection member is placed at least a part of a joint region in a predetermined range between the end surface of the terminal electrode and the inner surface of the terminal body. Preferably, the press head presses the outer surface of the terminal body against the chip component at a position containing the joint region. Preferably, a non-joint region that is not pressed by the press head exists on the outer surface of the terminal body near the mount portion.

In the structure, the terminal plate can easily be joined with the terminal electrode of the chip component within a limited area. In the vicinity of the mounting surface, formed is the non-joint region, where the terminal electrode and the terminal plate are not joined, a vibration from the chip component is hard to reach the board or so, and a prevention effect on acoustic noise is improved.

Preferably, a plurality of protrusions protruding toward the terminal electrode is formed on the inner surface of the terminal plate within a range where the press head presses. Preferably, the connection member is placed at least in a region surrounded by the plurality of protrusions between the end surface of the terminal electrode and the inner surface of the terminal plate. In this structure, an application amount of the connection member can be reduced, the connection member after being fixed has a thickness that is adjusted based on a height of the plurality of protrusions, and a joint strength is stabilized.

After the press head pushes the outer surface of the terminal plate, the connection member may remain within a region surrounded by the plurality of protrusions, but may spread to the outside of the region. In this structure, an unevenness of application amount of the connection member is absorbed, the connection member after being fixed has a thickness that is adjusted based on a height of the plurality of protrusions, and a joint strength is stabilized.

End surfaces of terminal electrodes of a plurality of chip components may be arranged side by side on the inner surface of the terminal plate, and the connection member is preferably placed between the end surface of the terminal electrode of each chip component and the inner surface of the terminal plate. In this structure, an electronic device having a plurality of chip components can easily be manufactured.

The connection members may be placed at a plurality of positions between the end surface of the terminal electrode and the inner surface of the terminal plate, and a first through hole going through front and rear surfaces of the terminal plate may be formed between the connection members at the plurality of positions. In this structure, an application state of the connection member in the joint region can be observed from outside via the first through hole. Moreover, bubbles contained in the connection member, such as a solder, can be released via the first through hole. This stabilizes the joint even if the amount of the connection member, such as a solder, is small.

A second through hole going through front and rear surfaces may be formed on the terminal plate. Preferably, a holding portion extends from an opening edge of the second through hole and supports a side surface of the chip component near a mounting surface. Preferably, the press head presses the outer surface of the terminal plate located closer to an anti-mounting surface than the second through hole.

When the second through hole is formed, the non-joint region can easily be formed, and the holding portion can also easily be formed. When the terminal plate is provided with the holding portion, the connection member can preliminary hold the chip component before being joined, and the terminal plate is easily joined with the terminal electrodes of the plurality of chip components.

An electronic device according to the present invention comprises:
 a chip component; and
 a terminal plate connected with the chip component, wherein an outer surface of the terminal plate comprises:
  a first surface roughness region having a first surface roughness; and
  a second surface roughness region having a second surface roughness that is smaller than the first surface roughness.
Preferably, the terminal plate comprises:
 a terminal body disposed correspondingly with the end surface of the terminal electrode of the chip component; and
 a mount portion continuously formed from the terminal body and used for connection with a mounting surface,
 the connection member is spread out in a joint region in a predetermined range between the end surface of the terminal electrode and the inner surface of the terminal body;
 a non-joint region that does not connect the terminal body and the end surface of the terminal electrode exists between a periphery of the joint region and the mount portion;
 the first surface roughness region exists on the outer surface of the terminal body corresponding with the joint region; and
 the second surface roughness region exists on the outer surface of the terminal body corresponding with the non-joint region located near the mount portion.

The outer surface of the terminal body of the terminal plate where the press head used in the method according to the present invention contacts is roughened due to influence of separation movement of the press head after the heating thereby. The outer surface of the terminal body of the terminal plate where the press head does not contact is not influenced from separation movement of the press head after the heating thereby and is smooth. Thus, a first surface roughness of the outer surface of the terminal body corresponding with the joint region is larger than a second surface roughness of the outer surface of the terminal body corresponding with the non-joint region located near the mount portion.

In the electronic device manufactured by the method according to the present invention, regions with different surface roughness are generated on the outer surface of the terminal body of the terminal plate due to the influence of heating by the press head. In the electronic device according to the present invention, the terminal plate and the terminal electrode of the chip component are definitely joined with an excellent joint strength. Even if an application amount of the connection member is small, the terminal plate and the terminal electrode of the chip component can definitely be connected with a small connection area. Thus, a vibration from the chip component is hard to reach the board or so, and a so-called acoustic noise can be prevented.

In the electronic device according to the present invention, the press head does not contact with the terminal plate on the side of the mount surface and does not deteriorate a tin plating or so on the surface of the terminal plate near the mounting surface. Thus, the terminal plate on the side of the mounting surface is favorably joined with a solder for mounting, and mounting failures or so can be reduced.

A first through hole going through front and rear surfaces may be formed on the terminal body of the terminal plate corresponding with the joint region.

A second through hole going through front and rear surfaces may be formed on the terminal plate. Preferably, a holding portion extends from an opening edge of the second through hole and supports a side surface of the chip component near the mounting surface. Preferably, the second surface roughness region ranges from a position where the second through hole is formed to a vicinity of the mount portion on the outer surface of the terminal body.

DESCRIPTION OF THE PREFERRED EMBODIMENTS

Hereinafter, the present invention is described based on embodiments shown in the figures.

First Embodiment

Figure 1A:
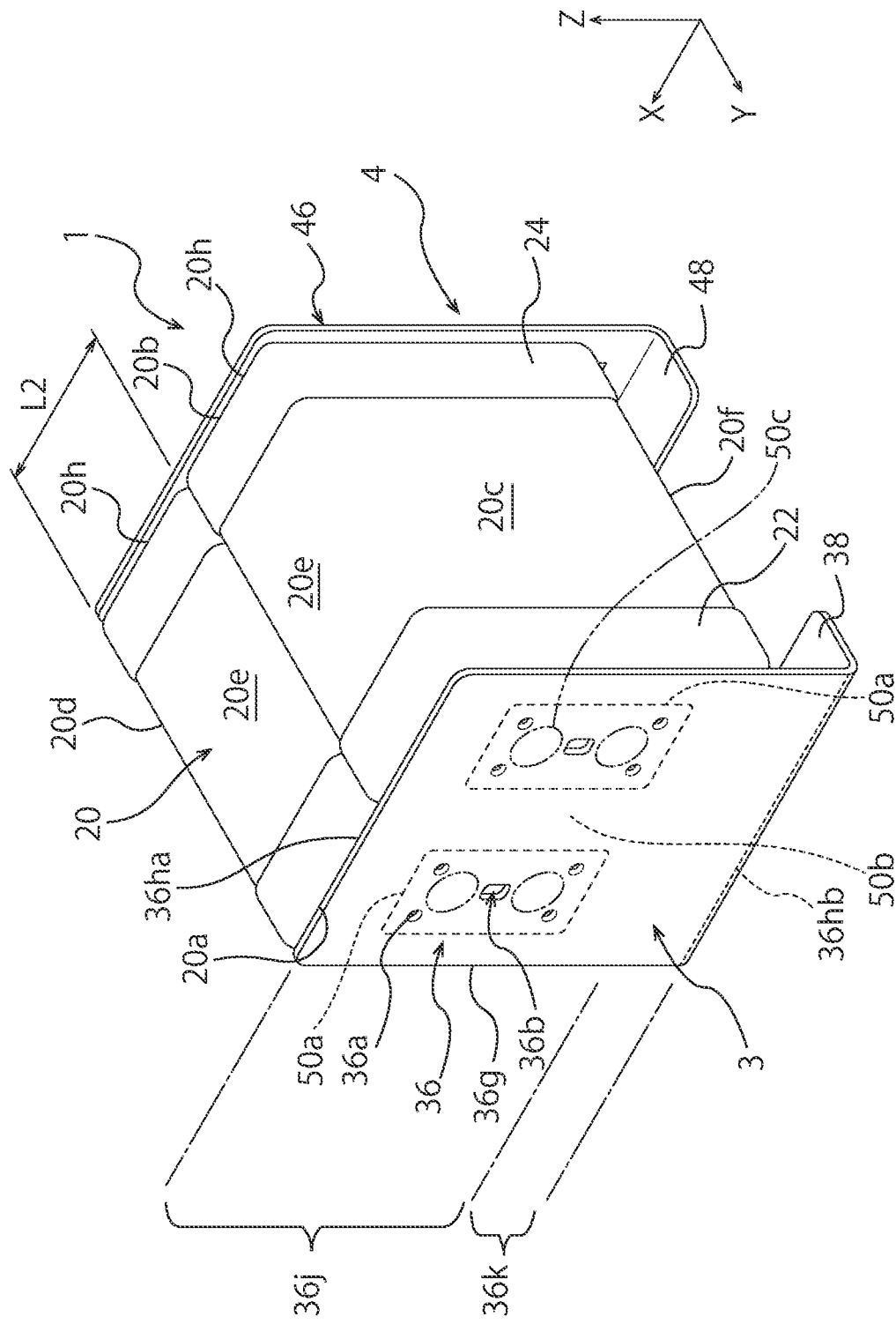
FIG. 1A is a schematic perspective view illustrating a ceramic electronic device according to First Embodiment of the present invention.

FIG. 1A is a schematic perspective view illustrating a capacitor 1 as an electronic device according to First Embodiment of the present invention. The capacitor 1 has capacitor chips 20 as chip components and a pair of metal terminal plates 3 and 4. The capacitor 1 according to First Embodiment has the two capacitor chips 20, but the capacitor 1 may have a single capacitor chip 20 or any plural capacitor chips 20.

Incidentally, each embodiment is described with a capacitor where the capacitor chips 20 are equipped with the terminal plates 3 and 4, but the ceramic electronic device of the present invention is not limited to this capacitor, and may be a chip component other than capacitors equipped with the terminal plates 3 and 4.

In the figures, the X-axis, the Y-axis, and the Z-axis are perpendicular to each other, the X-axis is parallel to a direction where the capacitor chips 20 are arranged as shown in FIG. 1, the Z-axis corresponds with a height direction of the capacitor 1 from a mount surface, and the Y-axis corresponds with a direction where a pair of terminal electrodes 22 and 24 of the chip 20 is mutually arranged on the opposite side.

Figure 2A:
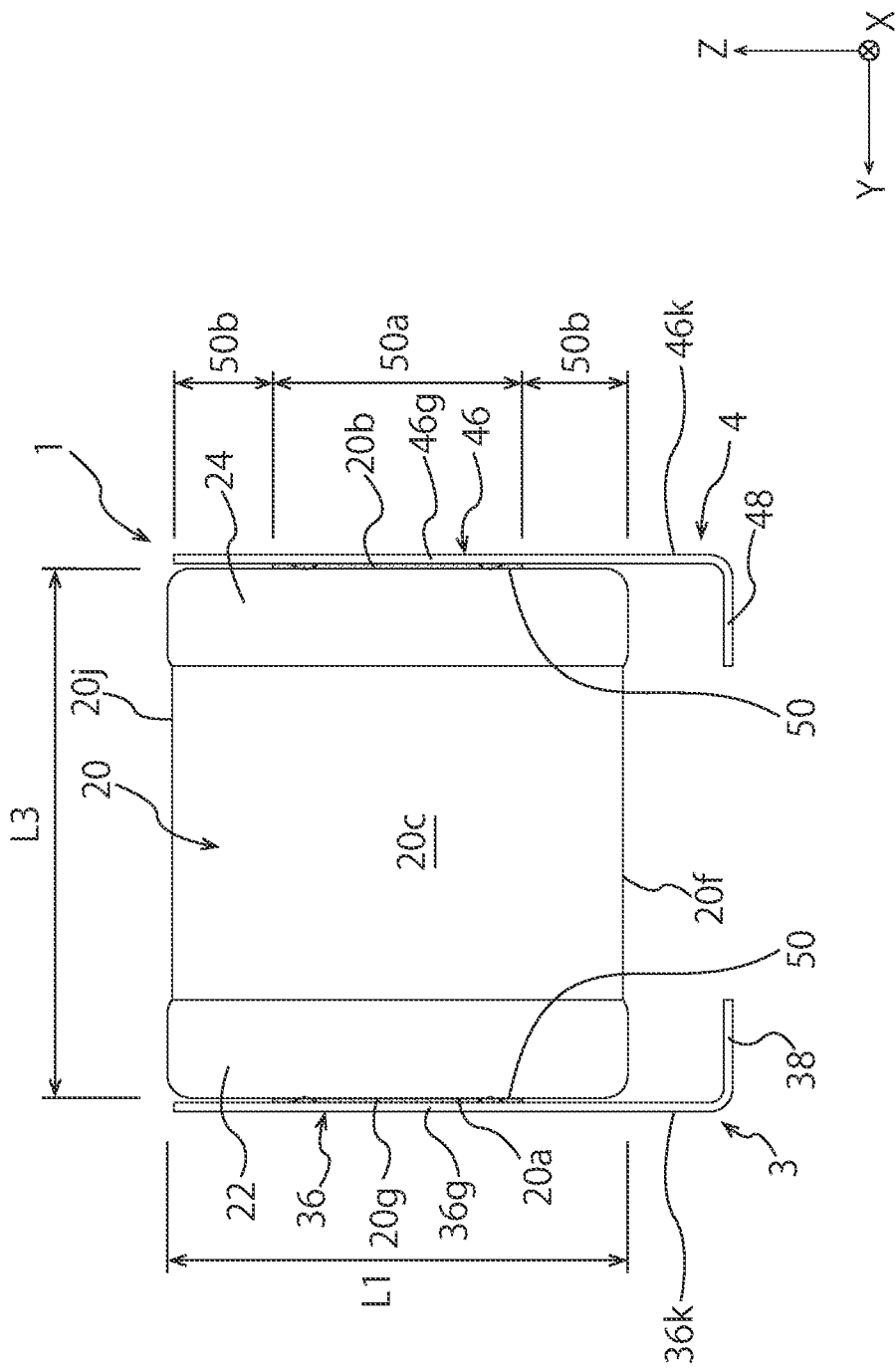
FIG. 2A is a front view of the ceramic electronic device shown in FIG. 1A.

The capacitor chips 20 have an approximately rectangular parallelepiped shape, and each of the two capacitor chips 20 has approximately the same shape and size. As shown in FIG. 2A, the capacitor chips 20 have a pair of chip end surfaces facing each other, and the pair of chip end surfaces consists of a first end surface 20a and a second end surface 20b. The first and second end surfaces 20a and 20b have an approximately rectangular shape. In four sides constituting each rectangle of the first and second end surfaces 20a and 20b, a pair of longer sides is chip first sides 20g (see FIG. 2A), and a pair of shorter sides is chip second sides 20h (see FIG. 1A).

The capacitor chips 20 are arranged so that the first end surfaces 20a and the second end surfaces 20b are perpendicular to a mount surface, in other words, the chip third sides 20j (FIG. 2A) of the capacitor chips 20 connecting between the first end surfaces 20a and the second end surfaces 20b are parallel to the mount surface of the capacitor 1. Incidentally, the mount surface of the capacitor 1 is a surface attached with the capacitor 1 by solder or so and facing mount portions 38 and 48 of the terminal plates 3 and 4 mentioned below, and is a parallel surface to the X-Y plane.

When comparing a length L1 of the chip first side 20g shown in FIG. 2A and a length L2 of the chip second side 20h shown in FIG. 1A, the chip second side 20h is shorter than the chip first side 20g (L1>L2). The chip first side 20g and the chip second side 20h have any length ratio, but L2/L1 is about 0.3 to 0.7, for example.

The capacitor chips 20 are arranged so that the chip first sides 20g are perpendicular to the mount surface as shown in FIG. 2A, and that the chip second sides 20h are parallel to the mount surface as shown in FIG. 1A. In the first to fourth side surfaces 20c to 20f, which are the four chip side surfaces connecting the first end surfaces 20a and the second end surfaces 20b, the first and second side surfaces 20c and 20d have large areas and are arranged perpendicularly to the mount surface, and the third and fourth side surfaces 20e and 20f have areas that are smaller than those of the first and second side surfaces 20c and 20d and are arranged in parallel to the mount surface. The third side surfaces 20e are upper side surfaces facing the opposite direction to the mount portions 38 and 48 below, and the fourth sides surfaces 20f are lower side surfaces facing the mount portions 38 and 48.

As shown in FIG. 1A, first terminal electrodes 22 of the capacitor chips 20 are formed to reach from the first end surfaces 20a to a part of the first to fourth side surfaces 20c to 20f. Thus, the first terminal electrode 22 has a part arranged on the first end surface 20a and a part arranged on the first to fourth side surfaces 20c and 20f.

The second terminal electrodes 24 of the capacitor chips 20 are formed to reach from the second end surfaces 20b to another part of the first to fourth side surfaces 20c to 20f (a different part from the part where the first terminal electrodes 22 reach). Thus, the second terminal electrode 24 has a part arranged on the second end surface 20b and a part arranged on the first to fourth side surfaces 20c to 20f. The first terminal electrodes 22 and the second terminal electrodes 24 are arranged with a predetermined distance on the first to fourth side surfaces 20c to 20f.

Figure 6:
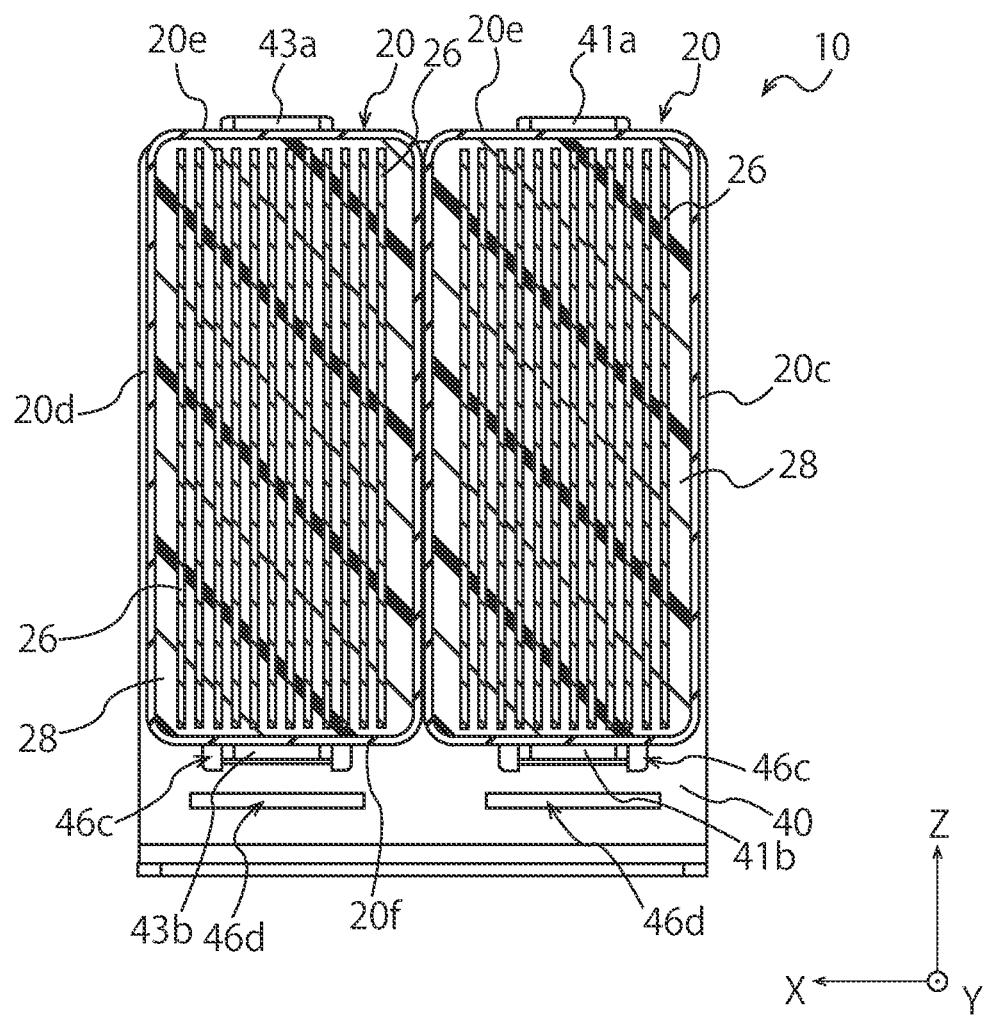
FIG. 6 is a cross-sectional view perpendicular to the Y-axis of the ceramic electronic device shown in FIG. 1B.

As shown in FIG. 6, which schematically illustrates an internal stracture of the capacitor chips 20, the capacitor chips 20 are a multilayer capacitor where internal electrode layers 26 and dielectric layers 28 are laminated. In the internal electrode layers 26, internal electrode layers 26 connected with the first terminal electrodes 22 and internal electrode layers 26 connected with the second terminal electrodes 24 are laminated alternately by sandwiching the dielectric layers 28.

As shown in FIG. 6, the internal electrode layers 26 of the capacitor chips 20 have a lamination direction that is parallel to the X-axis and perpendicular to the Y-axis. That is, the internal electrode layers 26 shown in FIG. 6 are arranged in parallel to the plane of the Z-axis and the Y-axis and perpendicularly to the mount surface. Incidentally, FIG. 6 illustrates a cross-sectional view of the capacitor chips 20 of the capacitor 10 according to Second Embodiment mentioned below, but the capacitor chips 20 of the capacitor 1 according to the present embodiment is similar to this cross-sectional view.

The dielectric layers 28 of the capacitor chips 20 are composed of any dielectric material, such as calcium titanate, strontium titanate, barium titanate, and a mixture thereof. Each of the dielectric layers 28 has any thickness, but normaly has a thickness of several μm to several hundred μm. In the present embodiment, each of the dielectric layers 28 preferably has a thickness of 1.0 to 20.0 μm.

The internal electrode layers 26 contain any conductive material, but may contain a comparatively inexpensive base metal when the dielectric layers 28 are composed of a reduction resistant material. The base metal is preferably Ni or a Ni alloy. The Ni alloy is preferably an alloy of Ni and one or more elements of Mn, Cr, Co, and Al, and preferably contains Ni at 95 wt % or more. Incidentally, Ni or the Ni alloy may contain various fine components, such as P, at about 0.1 wt % or less. The internal electrode layers 26 may be formed using a commercially available electrode paste. Each of the internal electrode layers 26 has a thickness appropriately determined based on usage or so.

The first and second terminal electrodes 22 and 24 are also composed of any material. The first and second terminal electrodes 22 and 24 are normally composed of copper, copper alloy, nickel, nickel alloy, or the like, but may be composed of silver, an alloy of silver and palladium, or the like. Each of the first and second terminal electrodes 22 and 24 also has any thickness, but normally has a thickness of about 10 to 50 μm. Incidentally, at least one metal film of Ni, Cu, Sn, etc. may be formed on the surfaces of the first and second terminal electrodes 22 and 24.

The capacitor chips 20 have shape and size that are appropriately determined based on object and usage. For example, the capacitor chip 20 has a length (L3 shown in FIG. 2A) of 1.0 to 6.5 mm, a width (L1 shown in FIG. 2A) of 0.5 to 5.5 mm, and a thickness (L2 shown in FIG. 1A) of 0.3 to 3.2 mm. When the capacitor 1 has a plurality of capacitor chips 20, each of the capacitor chips 20 may have mutually different size and shape.

As shown in FIG. 1A and FIG. 2A, a pair of terminal plates 3 and 4 of the capacitor 1 is arranged correspondingly with the first and second end surfaces 20a and 20b, which are a pair of chip end surfaces. That is, the first terminal plate 3, which is one of the pair of terminal plate 3 and 4, is arranged correspondingly with the first terminal electrodes 22, which are one of the pair of terminal electrodes 22 and 24, and the second terminal plate 4, which is the other of the pair of terminal plates 3 and 4, is arranged correspondingly with the second terminal electrodes 24, which are the other of the pair of terminal electrodes 22 and 24.

The first terminal plate 3 has an electrode facing portion (terminal body) 36 facing the terminal electrodes 22. Moreover, the first terminal plate 3 has a mount portion 38 extending from the electrode facing portion 36 toward the capacitor chips 20 and being at least partially approximately perpendicular to the electrode facing portion 36.

As shown in FIG. 2A, the electrode facing portion 36 has a substantially rectangular flat shape having a pair of terminal first sides 36g approximately parallel to the chip first sides 20g perpendicular to the mount surface and a pair of terminal second sides 36ha and 36hb approximately parallel to the chip second sides 20h parallel to the mount surface as shown in FIG. 1A.

As shown in FIG. 1A, the terminal second sides 36ha and 36hb parallel to the mount surface have a length that is several times plus or minus alpha of a length L2 of the chip second sides 20h arranged in parallel to the terminal second sides 36ha and 36hb. That is, the electrode facing portion 36 has a width in the X-axis that may be equal to, slightly shorter, or slightly longer than a length obtained by multiplying the number and X-axis width of the capacitor chips 20 contained in the capacitor 1.

The electrode facing portion 36 is electrically and mechanically connected with the first terminal electrodes 22 formed on the first end surfaces 20a facing the electrode facing portion 36. For example, the electrode facing portion 36 and the first terminal electrodes 22 can be connected with each other by arranging a conductive connection member 50, such as a solder and a conductive adhesive, in a space between the electrode facing portion 36 and the first terminal electrodes 22 shown in FIG. 2A.

Joint regions 50a are determined as a region where the connection member 50 joins the electrode facing portion 36 and the end surfaces of the first terminal electrodes 22. A non-joint region 50b is determined as a region where the electrode facing portion 36 and the end surfaces of the first terminal electrodes 22 are not joined without the connection member 50, and a space exists between the electrode facing portion 36 and the end surfaces of the first terminal electrodes 22. The space between the electrode facing portion 36 and the end surfaces of the first terminal electrodes 22 in the non-joint region 50b has a thickness that is approximately equal to a thickness of the connection member 50. In the present embodiment, the connection member 50 has a thickness that is determined based on a height of protrusions 36a mentioned below or so.

In the present embodiment, as shown in FIG. 1A, first through holes 36b are formed on a part of the electrode facing portion 36 facing the first end surfaces 20a. Two first through holes 36b are formed correspondingly with the capacitor chips 20 contained in the capacitor 1, but any shape and number of the first through holes 36b may be formed. In the present embodiment, the first through hole 36b is formed in an approximately central part of the joint region 50a.

As shown in FIG. 1A, the joint region 50a is formed by applying the connection member 50 (see FIG. 2A) to initial application regions 50c respectively positioned both sides of the first through hole 36b in the Z-axis direction. That is, after the connection member 50 is applied, the joint region 50a is formed in such a manner that the connection member 50 applied on the initial application regions 50c spreads out by bringing a press head 60 (shown in FIG. 2C) into contact with the outer surface (opposite to the chips 20) of the electrode facing portion 36 and pushing it against the end surface of the chip 20. The non-joint region 50b is a region where the connection member 50 is not spread out. In the present embodiment, a total area of the non-joint region 50b between the electrode facing portion 36 and the end surfaces of the terminal electrodes 22 in the Y-axis direction is larger than 3/10, preferably 1/2 to 10, of a total area of the joint regions 50a.

In the present embodiment, the connection member 50 composed of a solder forms a solder bridge between a periphery of the first through hole 36b and the first terminal electrode 22, and the electrode facing portion 36 and the first terminal electrode 22 can thereby be joined strongly. Moreover, an application state of the connection member 50 in the joint region 50a can be observed from outside via the first through hole 36b. Moreover, bubbles contained in the connection member 50, such as a solder, can be released via the first through hole 36*b*. This stabilizes the joint even if the amount of the connection member 50, such as a solder, is small.

The electrode facing portion 36 is provided with a plurality of protrusions 36*a* protruding toward the first end surfaces 20*a* of the capacitor chips 20 and touching the first end surfaces 20*a* so that the plurality of protrusions 36*a* surrounds the first through holes 36*b*. In addition, the protrusions 36*a* may be formed outside the initial application regions 50*c*, or the initial application regions 50*c* may be positioned between the protrusions 36*a* and the first through hole 36*b*. Incidentally, the initial application region 50*c* may protrude from between the protrusion 36*a* and the first through hole 36*b*.

The protrusions 36*a* reduce a contact area between the electrode facing portion 36 and the first terminal electrodes 22. This makes it possible to prevent a vibration generated in the chip capacitors 20 from traveling to the mount board via the first terminal plate 3 and prevent an acoustic noise of the ceramic capacitor 1.

The protrusions 36*a* are formed around the first through hole 36*b*, and the joint region 50*a* formed by the spread of the connection member 50, such as a solder, can thereby be adjusted. In the present embodiment, the joint region 50*a* has a periphery positioned slightly outside the protrusions 36*a*. In particular, as shown in FIG. 1, a lower end of the joint region 50*a* in the Z-axis direction is positioned near an upper opening edge of a second through hole 36*c* mentioned below.

In the capacitor 1, an acoustic noise can be prevented while a connection strength between the electrode facing portion 36 and the first terminal electrodes 22 is adjusted in an appropriate range. Incidentally, four protrusions 36*a* are formed around one first through hole 36*b* in the capacitor 1, but any number and arrangement of the protrusions 36*a* may be employed.

As shown in FIG. 1A, the electrode facing portion 36 has a plate body part 36*j* and an intermediate connection part 36*k*. The plate body part 36*j* faces the first end surfaces 20*a* of the capacitor chips 20 and is positioned at a height overlapping with the first end surfaces 20*a*. The intermediate connection part 36*k* is positioned below the plate body part 36*j* and is located at a position connecting between the plate body part 36*j* and the mount portion 38.

The mount portion 38 is connected with the terminal second side 36*hb* below in the electrode facing portion 36 (negative side of the Z-axis direction). The mount portion 38 extends from the terminal second side 36*hb* below toward the inner side of the capacitor chips 20 in the Y-axis direction (center side of the chips 20) and is bent approximately perpendicularly to the electrode facing portion 36. Incidentally, the top surface of the mount portion 38, which is a surface of the mount portion 38 closer to the capacitor chips 20, preferably has a solder wettability that is lower than a solder wettability of the bottom surface of the mount portion 38 in order to prevent an excessive scattering of a solder used when the capacitor chips 20 are mounted on a board.

The mount portion 38 of the capacitor 1 is mounted on a mount surface, such as a mount board, in a position facing downward. Thus, a height of the capacitor 1 in the Z-axis direction is a height of the capacitor 1 when being mounted. In the capacitor 1, the mount portion 38 is connected with the terminal second side 36*hb* on one side of the electrode facing portion 36, and the terminal second side 36*ha* on the other side of the electrode facing portion 36 substantially corresponds to the upper ends of the chips 20 in the Z-axis direction. Thus, the capacitor 1 has no unnecessary part of the length in the Z-axis direction and is advantageous in reducing its height.

Since the mount portion 38 is connected with the terminal second side 36*hb* on one side of the electrode facing portion 36, the capacitor 1 can have a small projected area in the Z-axis direction and have a small mount area, compared to prior arts where the mount portion 38 is connected with the terminal first sides 36*g* of the electrode facing portion 36. Since the third and fourth side surfaces 20*e* and 20*f* having small areas among the first to fourth side surfaces 20*c* to 20*f* of the capacitor chips 20 are arranged in parallel to the mount surface, the capacitor 1 can have a small mount area even if the capacitor chips 20 are not overlapped with each other in the height direction.

As shown in FIG. 1A and FIG. 2A, the second terminal plate 4 has an electrode facing portion (terminal body) 46 and a mount portion 48. The electrode facing portion 46 faces the second terminal electrodes 24. The mount portion 48 extends from the electrode facing portion 46 toward the capacitor chips 20 and is at least partially approximately perpendicular to the electrode facing portion 46.

As is the case with the electrode facing portion 36 of the first terminal plate 3, the electrode facing portion 46 of the second terminal plate 4 has a pair of terminal first sides 46*g* approximately parallel to the chip first sides 20*g* and a terminal second side 46*ha* approximately parallel to the chip second sides 20*h*. The electrode facing portion 46 is provided with protrusions 46*a* (see FIG. 2C) and second through holes 46*b* (see FIG. 2C), which are similar to the protrusions 36*a*, the first through holes 36*b*, the second through holes 36*c*, and the slits 36*d* formed on the electrode facing portion 36.

The second terminal plate 4 is arranged symmetrically to the first terminal plate 3 and is different from the first terminal plate 3 in arrangement against the capacitor chips 20. The second terminal plate 4 is, however, different from the first terminal plate 3 only in arrangement against the capacitor chips 20 and has a similar shape to the first terminal plate 3. Thus, the second terminal plate 4 is not described in detail.

The first terminal plate 3 and the second terminal plate 4 are composed of any conductive metal material, such as iron, nickel, copper, silver, and an alloy thereof. In particular, the first and second terminal plates 3 and 4 are preferably composed of phosphor bronze in consideration of restraining resistivity of the first and second terminal plates 3 and 4 and reducing ESR of the capacitor 1.

Hereinafter, a method of manufacturing the capacitor 1 is described.

Method of Manufacturing Multilayer Capacitor Chip 20

In a manufacture of the multilayer capacitor chip 20, a laminated body is prepared by laminating green sheets (to be the dielectric layers 28 after firing) with electrode patterns to be the internal electrode layers 26 after firing, and a capacitor element body is obtained by pressurizing and firing the obtained laminated body. Moreover, the first and second terminal electrodes 22 and 24 are formed on the capacitor element body by baking and plating a terminal electrode paint, and the capacitor chip 20 is thereby obtained.

A green sheet paint and an internal electrode layer paint, which are raw materials of the laminated body, a raw material of the terminal electrodes, firing conditions of the laminated body and the electrodes, and the like are not limited, and can be determined with reference to known manufacturing methods or so. In the present embodiment, ceramic green sheets whose main component is barium titanate are used as a dielectric material. In the terminal electrodes, a Cu paste is immersed and baked to form a baked layer, and a Ni plating treatment and a Sn plating treatment are conducted, whereby Cu baked layer/Ni plating layer/Sn plating layer is formed.

Method of Manufacturing Terminal Plates 3 and 4

In a manufacture of the first terminal plate 3, a metal plate is firstly prepared. The metal plate is composed of any conductive metal material, such as iron, nickel, copper, silver, and an alloy thereof. Next, the metal plate is machined to form intermediate members having shapes of the electrode facing portion 36 with the protrusions 36a and the first through holes 36b, the mount portion 38, and the like.

Next, a metal film is formed by plating on the surfaces of the intermediate members formed by machining, and the first terminal plate 3 is obtained. Any material, such as Ni, Sn, and Cu, is used for the plating. In the plating treatment, a resist treatment against a top surface of the mount portion 38 can prevent the plating from attaching to the top surface of the mount portion 38. This makes it possible to generate a difference in solder wettability between the top surface and the bottom surface of the mount portion 38. Incidentally, a similar difference can be generated by conducting a plating treatment against the entire intermediate members for formation of a metal film and removing only the metal film formed on the top surface of the mount portion 38 using a laser exfoliation or so.

Incidentally, in the manufacture of the first terminal plate 3, a plurality of first terminal plates 3 may be formed in a state of being connected with each other from a metal plate continuously formed in belt shape. The plurality of first terminal plates 3 is cut into pieces before or after being connected with the capacitor chip 20. The second terminal plate 4 is manufactured in a similar manner to the first terminal plate 3.

Assembly of Capacitor 1

Two capacitor chips 20 obtained in the above-mentioned manner are prepared and held so that the second side surface 20d and the first side surface 20c are arranged to touch each other as shown in FIG. 1. As shown in FIG. 2C, a rear surface (inner surface) of the first terminal plate 3 faces the end surfaces of the first terminal electrodes 22 in the Y-axis direction, and the second terminal plate 4 faces the end surfaces of the second terminal electrodes 24 in the Y-axis direction.

At this time, the connection members 50 (see FIG. 2C), such as a cream solder, are applied to the initial application regions 50c shown in FIG. 1A on the end surfaces of the first terminal electrodes 22 in the Y-axis direction or on the rear surface of the first terminal plate 3. The connection member 50 (see FIG. 2C), such as a cream solder, is similarly applied at positions corresponding with the initial application regions 50c shown in FIG. 1A on the end surfaces of the second terminal electrodes 24 in the Y-axis direction or on the rear surface of the second terminal plate 4. The connection member 50 is applied by any method, such as solder application using a dispenser.

As shown in FIG. 2C, the press head 60 thereafter contacts with the outer surface of the electrode facing portion 36 (the same applies to the electrode facing portion 46) and presses and heats the electrode facing portion 36 against the end surfaces of the chips 20. The press head 60 is, for example, a resistant heating portion. The press head 60 generates heat by itself and instantly heats the electrode facing portion 36 and the solder on the initial application regions 50c. The press head 60 has any heating temperature that can melt the connection member 50 formed of solder. Preferably, the head 60 continuously presses the electrode facing portion 36 even after the head 60 stops generating heat. The head 60 presses the electrode facing portion 36 at any pressure, but preferably presses the electrode facing portion 36 at 0.01 to 5 MPa.

The heating and pressing spread the connection member 50 applied on the initial application regions 50c and produce the joint regions 50a shown in FIG. 1A. The non-joint region 50b is a region where the connection member 50 is not spread out. This allows the first and second terminal plates 3 and 4 to be electrically and mechanically connected with the first and second terminal electrodes 22 and 24 of the capacitor chips 20. Then, the capacitor 1 is obtained.

Figure 4:
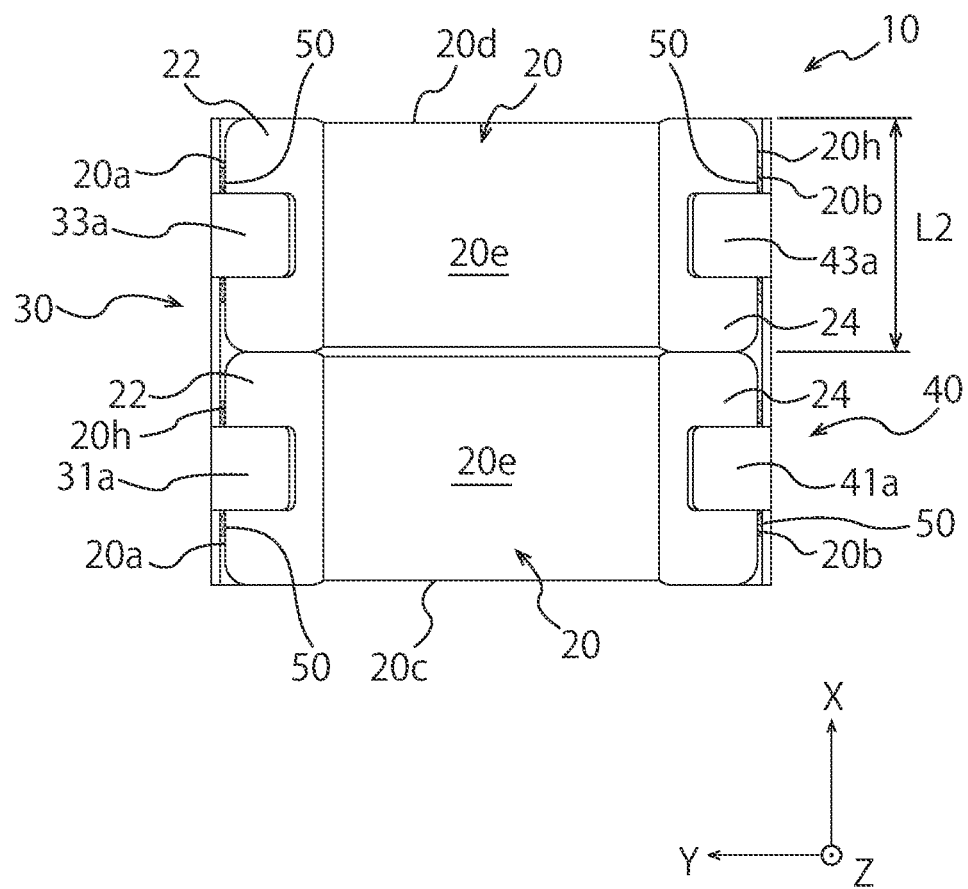
FIG. 4 is a top view of the ceramic electronic device shown in FIG. 1B.

In the capacitor 1 obtained in this way, a height direction (Z-axis direction) of the capacitor 1 is identical to directions of the chip first sides 20g, which are longer sides of the capacitor chips 20, and the mount portions 38 and 48 are formed by being bent from the terminal second side 36hb toward below the capacitor chips 20. Thus, the capacitor 1 has a small projected area in the height direction of the capacitor 1 (see FIG. 4 and FIG. 5), and can have a small mount area.

Moreover, since a plurality of capacitor chips 20 is arranged and laminated in the parallel direction to the mount surface, the capacitor 1 has a short transmission path and can achieve a low ESL.

Since the first through holes 36b are formed, a connection state between the first and second terminal plate portions 30 and 40 and the chip capacitors 20 can easily be recognized from outside, and the ceramic capacitor 1 can thereby have a reduced quality dispersion and an improved non-defective product ratio.

The non-joint region 50b, which does not connect between the electrode facing portion 36 (46) and the end surfaces of the terminal electrodes 22 (24), is formed between the peripheries of the joint regions 50a and the mount portion 38 (48). In the non-joint region 50b, the electrode facing portion 36 (46) of the terminal plate 3 (4) can freely elastically be deformed without being disturbed by the terminal electrodes 22 (24), and stress is reduced. Thus, the terminal plate 3 (4) is easily elastically deformed, and an acoustic noise phenomenon can be prevented effectively.

A total area of the non-joint region 50b is larger than 3/10 of a total area of the joint regions 50a and is within a predetermined range between the electrode facing portion 36 (46) and the terminal electrodes 22 (24). This structure improves the effects of the present embodiment.

In the non-joint region 50b, a space whose thickness is approximately equal to a thickness of the connection member 50 exists between the electrode facing portion 36 (46) and the end surfaces of the terminal electrodes 22 (24). The space enables the electrode facing portion 36 (46) of the non-joint region 50b to freely elastically be deformed without any disturbance from the terminal plate 3 (4).

Moreover, the end surfaces of the terminal electrodes 22 (24) of a plurality of chips 20 may be joined side by side with the electrode facing portion 36 (46) in a plurality of joint regions 50a, and the non-joint region 50b is formed between the joint regions 50a adjacent to each other. In this structure, a pair of terminal plates 3 and 4 can easily connect a plurality of chips 20, and an acoustic noise phenomenon can be prevented due to the existence of the non-joint region 50b existing between the chips 20.

Moreover, in the present embodiment, the protrusions 36a protruding toward the end surfaces of the terminal electrodes 22 (24) are formed on the inner surface of the electrode facing portion 36 (46). This structure can easily control the joint regions 50a of the connection member 50 and a thickness of the joint regions 50a. In addition, this structure stabilizes the connection of the connection member even if the amount of the connection member is small.

In particular, the method of manufacturing the capacitor 1 according to the present embodiment does not use a reflow furnace, and the apparatus thereby does not become large-scale, which contributes to a reduction in manufacturing cost. In the method according to the present embodiment, the press head 60 contacts with the outer surface of the terminal plate 3 (4) and presses and heats the terminal plate 3 (4) against the terminal electrodes 22 (24) in a predetermined region of the terminal plate 3 (4). Thus, heat travels from the terminal plates 3 and 4 to the connection member 50, such as cream solder, and the connection member 50 is molten and spread out in a predetermined range and joins the terminal plate 3 (4) and the terminal electrodes 22 (24). Thus, heat can definitely be added to the initial application regions 50c, and the terminal plates 3 and 4 and the terminal electrodes 22 and 24 of the chips 20 can thereby definitely be connected with an excellent connection strength.

Even if an application amount of the connection member 50 is small, the terminal plates 3 and 4 and the terminal electrodes 22 and 24 of the chips 20 can definitely be connected with a small connection area. Thus, a vibration from the chips 20 is hard to reach the board or so, and a so-called acoustic noise can be prevented.

In the method according to the present embodiment, the press head 60 does not contact with the electrode facing portion 36 (46) of the terminal plate 3 (4) on the side of the mount portion 38 (48) as shown in FIG. 2C and does not deteriorate a tin plating or so on the surface of the terminal plate 3 (4) near the mounting surface. Thus, the terminal plate 3 (4) on the side of the mount portion 38 (48) is favorably joined with a solder for mounting, and mounting failures or so can be reduced.

In the present embodiment, the connection member 50 is placed in the initial application regions 50c, which are at least a part of the joint regions 50a in a predetermined range, between the end surfaces of the terminal electrodes 22 (24) and the inner surface of the electrode facing portion 36 (46). The press head 60 presses the outer surface of the electrode facing portion 36 (46) against the chips 20 at a position including the joint regions 50a and does not push the outer surface of the electrode facing portion 36 (46) positioned in the non-joint region 50b near the mount portion 38 (48).

In the present embodiment, as shown in FIG. 2C, the press head 60 contacts with the terminal plate 3 (4) in an area containing at least all of the joint regions 50a shown in FIG. 1A within a predetermined length L1a from the upper end of the electrode facing portion 36 (46) in the Z-axis direction and within a full length of the electrode facing portion 36 (46) in the X-axis direction.

In the structure, the terminal plate 3 (4) can easily be joined with the terminal electrodes 22 (24) of the chips 20 within a limited area. In the vicinity of the mount portion 38 (48), formed is the non-joint region 50b, where the terminal electrodes 22 (24) and the terminal plate 3 (4) are not joined, a vibration from the chips 20 is hard to reach the board or so, and a prevention effect on acoustic noise is improved.

The length L1a (see FIG. 2C) in the Z-axis direction, where the press head 60 contacts with the outer surface of the electrode facing portion 36 (46) of the terminal plate 3 (4), is determined with relation to the length L1 of the chip first sides 20g shown in FIG. 2A. Preferably, L1a/L1 is 0.3 to 0.9. Moreover, the length L1a is determined so that all of the initial application regions 50c shown in FIG. 2C are contained within the range of length L1a. Preferably, the length L1a is determined so that all of the protrusions 36a (46a) shown in FIG. 2C are contained within the range of length L1a.

The width of the press head 60 in the X-axis direction shown in FIG. 2C is preferably equal to or larger than the width of the electrode facing portion 36 (46) of the terminal plate 3 (4) in the X-axis direction shown in FIG. 1A, but is preferably equal to or larger than a width containing at least all of a plurality of joint regions 50a arranged side by side in the X-axis direction.

The uppermost position of the press head 60 in the Z-axis direction shown in FIG. 2C is preferably equal to or higher than the uppermost position of the electrode facing portion 36 (46), but may be lower than the uppermost position of the electrode facing portion 36 (46). However, the uppermost position of the press head 60 in the Z-axis direction shown in FIG. 2C is preferably determined so that all of a plurality of joint regions 50a shown in FIG. 1A are contained.

The outer surface of the electrode facing portion 36 (46) of the terminal plate 3 (4) where the press head 60 used in the method according to the present embodiment contacts is roughened due to influence of separation movement of the press head 60 after the heating thereby. The outer surface of the electrode facing portion 36 (46) of the terminal plate 3 (4) where the press head 60 does not contact is not influenced from separation movement of the press head 60 after the heating thereby and is smooth.

Thus, a first surface roughness of the outer surface of the electrode facing portion 36 (46) corresponding with the joint regions 50a is larger than a second surface roughness of the outer surface of the electrode facing portion 36 (46) corresponding with the non-joint region 50b located near the mount portion 38 (48). In the capacitor 1 manufactured by the method according to the present embodiment, regions with different surface roughness are generated on the outer surface of the electrode facing portion 36 (46) of the terminal plate 3 (4) due to the influence of heating by the press head 60.

The region corresponding with the length L1a in the Z-axis direction shown in FIG. 2C has the first surface roughness, and the region corresponding with the length L1b from the lowermost position of the length L1a to the lower surfaces 20f of the chips 20 in the Z-axis direction has the second surface roughness. In the present embodiment, the length L1b may substantially correspond with or may be smaller than the length of the non-joint region 50b near the mount portion 38 (48) in the Z-axis direction. In any case, the region with the second surface roughness (region having the length L1b), which is smaller than the first roughness, exists on the outer surface of the electrode facing portion 36 (46) corresponding with the non-joint region 50b (see FIG. 2A) located near the mount portion 38 (48).

Incidentally, the first surface roughness and the second surface roughness can be measured by JIS B0601. The region with the second surface roughness is smooth and formed not only in the region with length L1b of the electrode facing portion 36 (46) shown in FIG. 2C, but is continuously formed on the outer surface of the intermediate connection part 36k (46k) and the outer surface of the mount portion 38 (48).

In the capacitor 1 according to the present embodiment, the terminal plate 3 (4) and the terminal electrodes 22 (24) of the chips 20 are definitely joined with an excellent joint strength. Even if an application amount of the connection member 50 is small, the terminal plates 3 and 4 and the terminal electrodes 22 and 24 of the chips 20 can definitely be connected with a small connection area. Thus, a vibration from the chips 20 is hard to reach the board or so, and a so-called acoustic noise can be prevented.

In the capacitor 1 according to the present embodiment, the press head 60 does not contact with the terminal plate 3 (4) near the mount portion 38 (48) and does not deteriorate a tin plating or so on the surface of the terminal plate 3 (4) near the mount portion 38 (48). Thus, the terminal plate 3 (4) on the side of the mount portion 38 (48) is favorably joined with a solder for mounting, and mounting failures can be reduced.

Second Embodiment

Figure 1B:
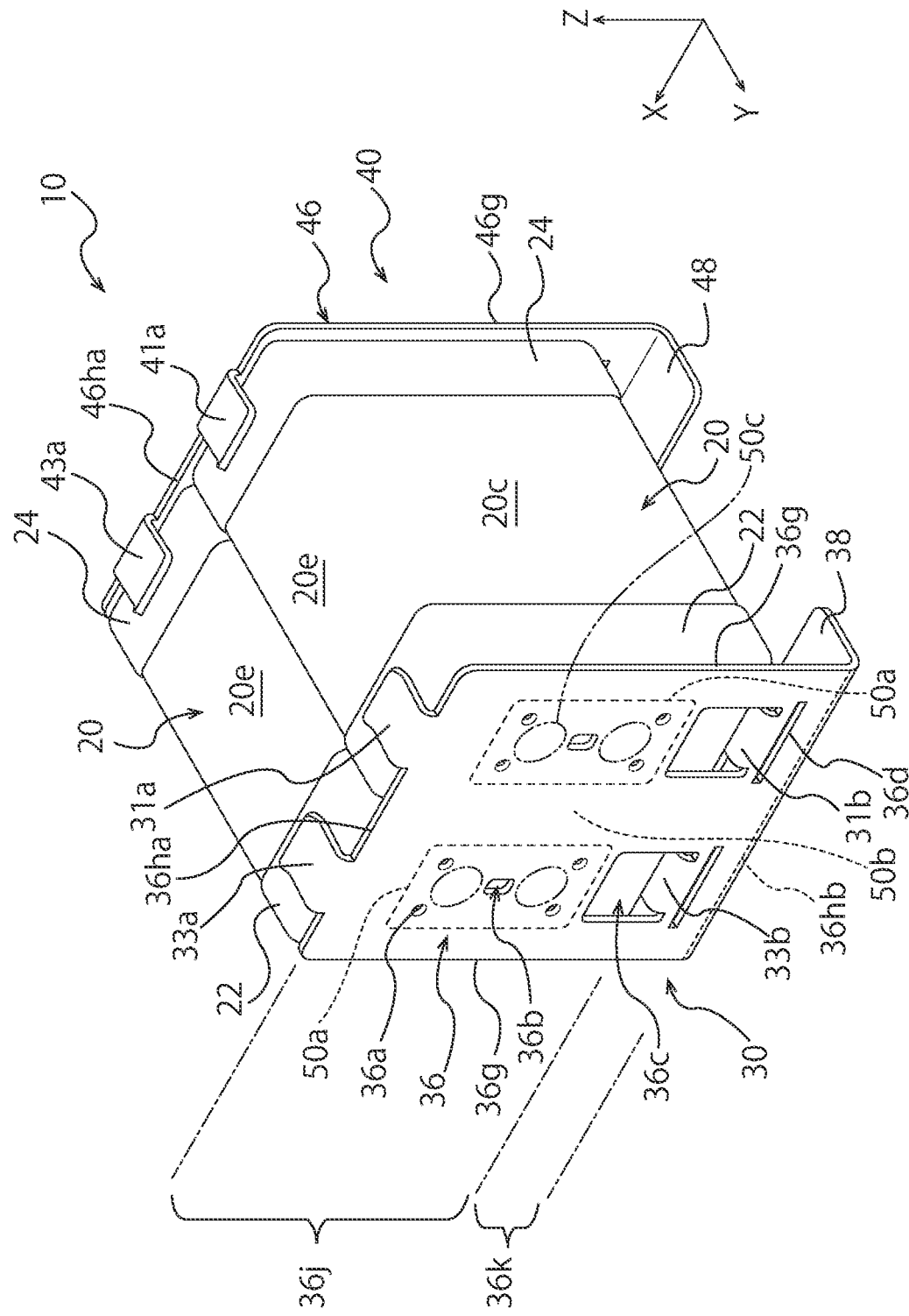
FIG. 1B is a schematic perspective view illustrating a ceramic electronic device according to another embodiment of the present invention.

FIG. 1B is a schematic perspective view of a capacitor 10 as an electronic device according to Second_Embodiment of the present invention. The capacitor 10 has capacitor chips 20 as chip components and a pair of terminal plates 30 and 40. In the capacitor 10 according to Second Embodiment, the terminal plates 30 and 40 are replaced with the terminal plates 3 and 4 according to First Embodiment, and other components are common with those of the capacitor 1 according to First Embodiment. In the following description, different parts from the capacitor 1 according to First Embodiment are mainly described, and common parts with the capacitor 1 according to First Embodiment are not partially described. In the figures, the common members are provided with common references.

Figure 3A:
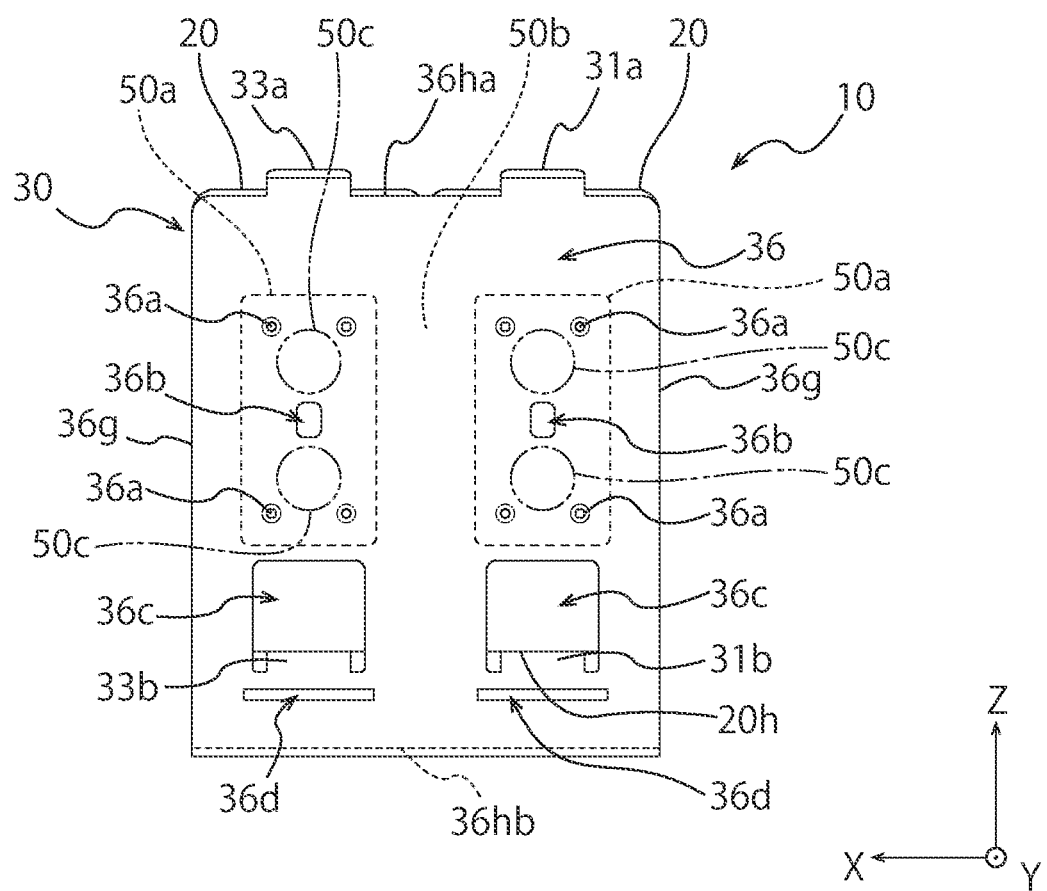
FIG. 3A is a left-side view of the ceramic electronic device shown in FIG. 1B.
Figure 3B:
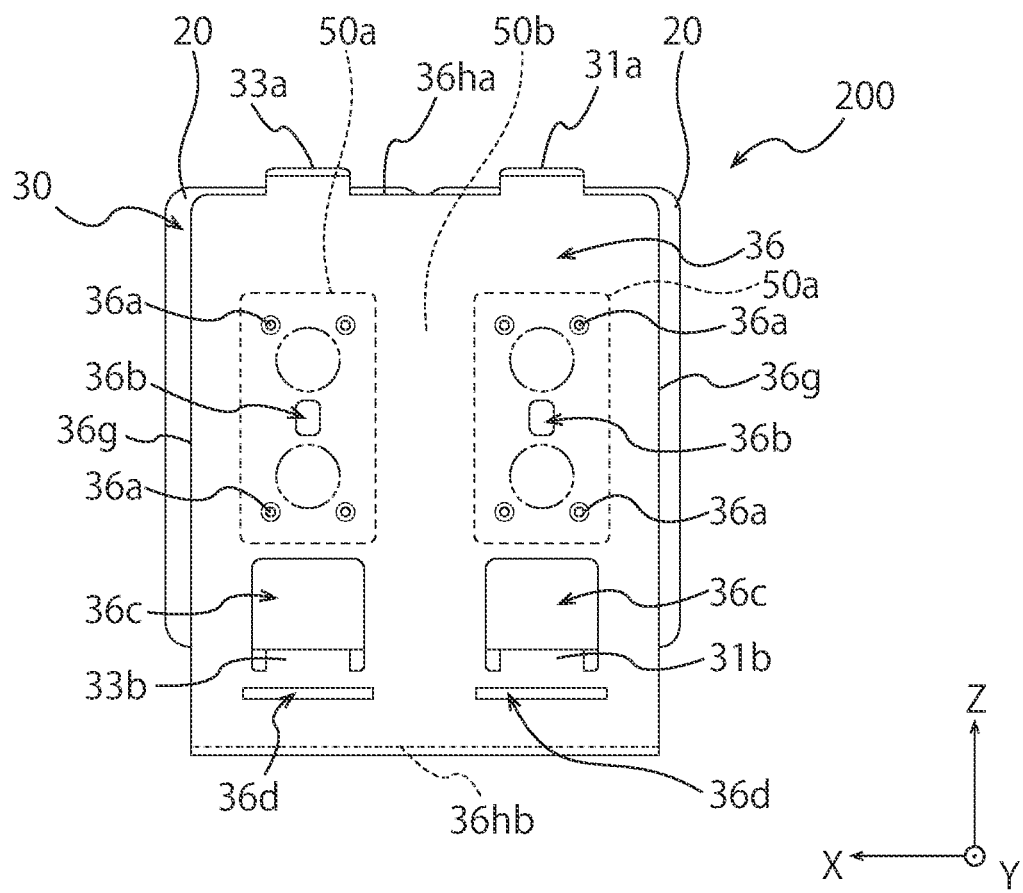
FIG. 3B is a left-side view of a ceramic electronic device according to a variation of FIG. 3A.

As shown in FIG. 3A and FIG. 3B (First Variation), the terminal second sides 36$ha$ and 36$hb$ parallel to the mount surface have a length that is several times plus or minus alpha of a length L2 (see FIG. 4) of the chip second sides 20$h$ arranged in parallel to the terminal second sides 36$ha$ and 36$hb$. That is, the electrode facing portion 36 has a width in the X-axis that may be equal to, slightly shorter, or slightly longer than a length obtained by multiplying the number and X-axis width of the capacitor chips 20 contained in the capacitor 10 shown in FIG. 3A or a capacitor 200 shown in FIG. 3B.

For example, the capacitor 200 according to First Variation shown in FIG. 3B includes two capacitor chips 20, and terminal second sides 36$ha$ and 36$hb$ parallel to a mount surface have a length that is shorter than a double of a length L2 of a chip second side 20$h$ arranged in parallel to the terminal second sides 36$ha$ and 36$hb$. Incidentally, the capacitor 200 is the same as the capacitor 10 shown in FIG. 1B, FIG. 2B, and FIG. 3 to FIG. 6 except that the chip second sides of the capacitor chips 20 have a length that is longer than a length of the chip second sides 20$h$ of the capacitor chips 20 according to the embodiment.

On the other hand, the capacitor 10 according to Second Embodiment shown in FIG. 3A includes two capacitor chips 20, and the terminal second sides 36$ha$ and 36$hb$ parallel to the mount surface have a length that is the same as or slightly longer than a double of a length L2 of the chip second side 20$h$ arranged in parallel to the terminal second sides 36$ha$ and 36$hb$. As shown in FIG. 3A, a capacitor chip that can be combined with the terminal plates 30 and 40 does not have only one size, and the terminal plates 30 and 40 can constitute an electronic device correspondingly with multiple kinds of capacitor chips 20 having different lengths in the X-axis direction.

The electrode facing portion 36 is electrically and mechanically connected with the first terminal electrodes 22 formed on the first end surfaces 20$a$ facing the electrode facing portion 36. For example, the electrode facing portion 36 and the first terminal electrodes 22 can be connected with each other by arranging a conductive connection member 50, such as a solder and a conductive adhesive, in a space between the electrode facing portion 36 and the first terminal electrodes 22 shown in FIG. 2B.

Joint regions 50$a$ are determined as a region where the connection member 50 joins the electrode facing portion 36 and the end surfaces of the first terminal electrodes 22. A non-joint region 50$b$ is determined as a region where the electrode facing portion 36 and the end surfaces of the first terminal electrodes 22 are not joined without the connection member 50, and a space exists between the electrode facing portion 36 and the end surfaces of the first terminal electrodes 22. The space between the electrode facing portion 36 and the end surfaces of the first terminal electrodes 22 in the non-joint region 50$b$ has a thickness that is approximately equal to a thickness of the connection member 50. In the present embodiment, the connection member 50 has a thickness that is determined based on a height of protrusions 36$a$ mentioned below or so.

Figure 2B:
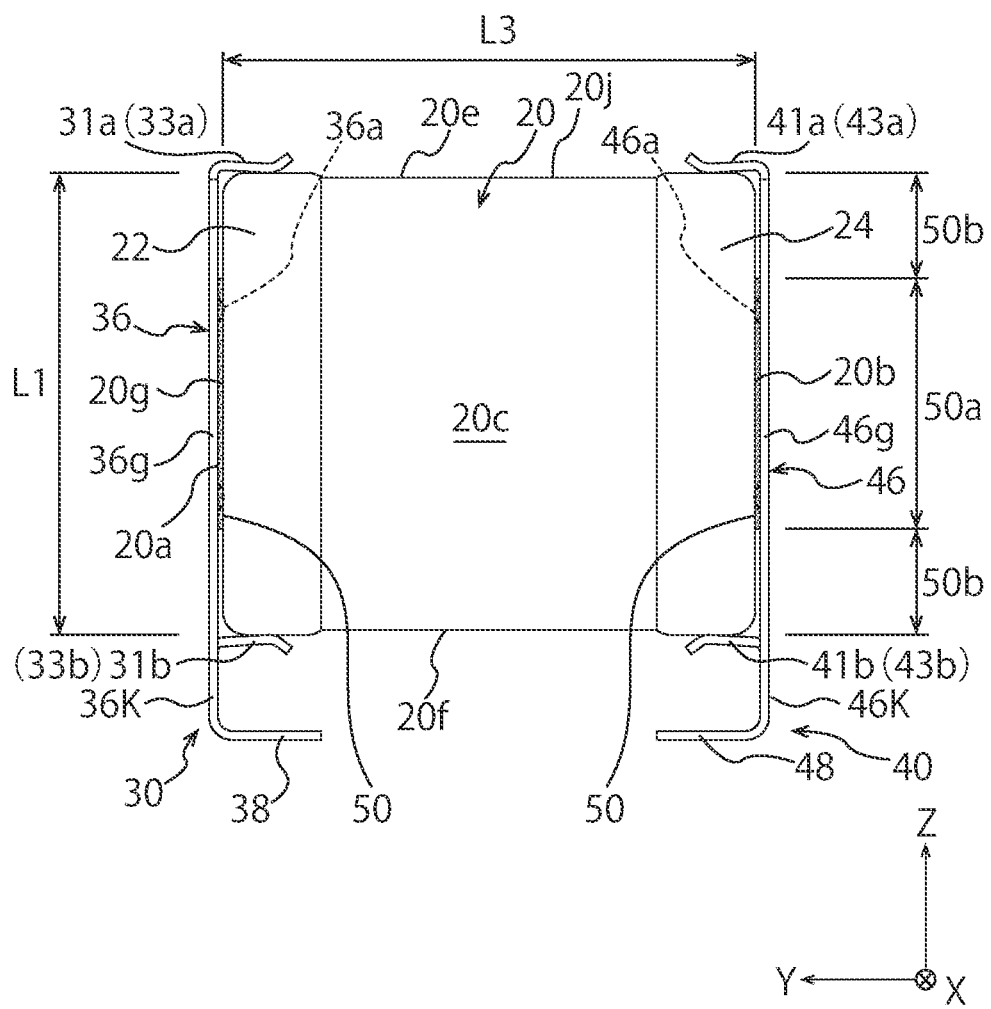
FIG. 2B is a front view of the ceramic electronic device shown in FIG. 1B.
Figure 2C:
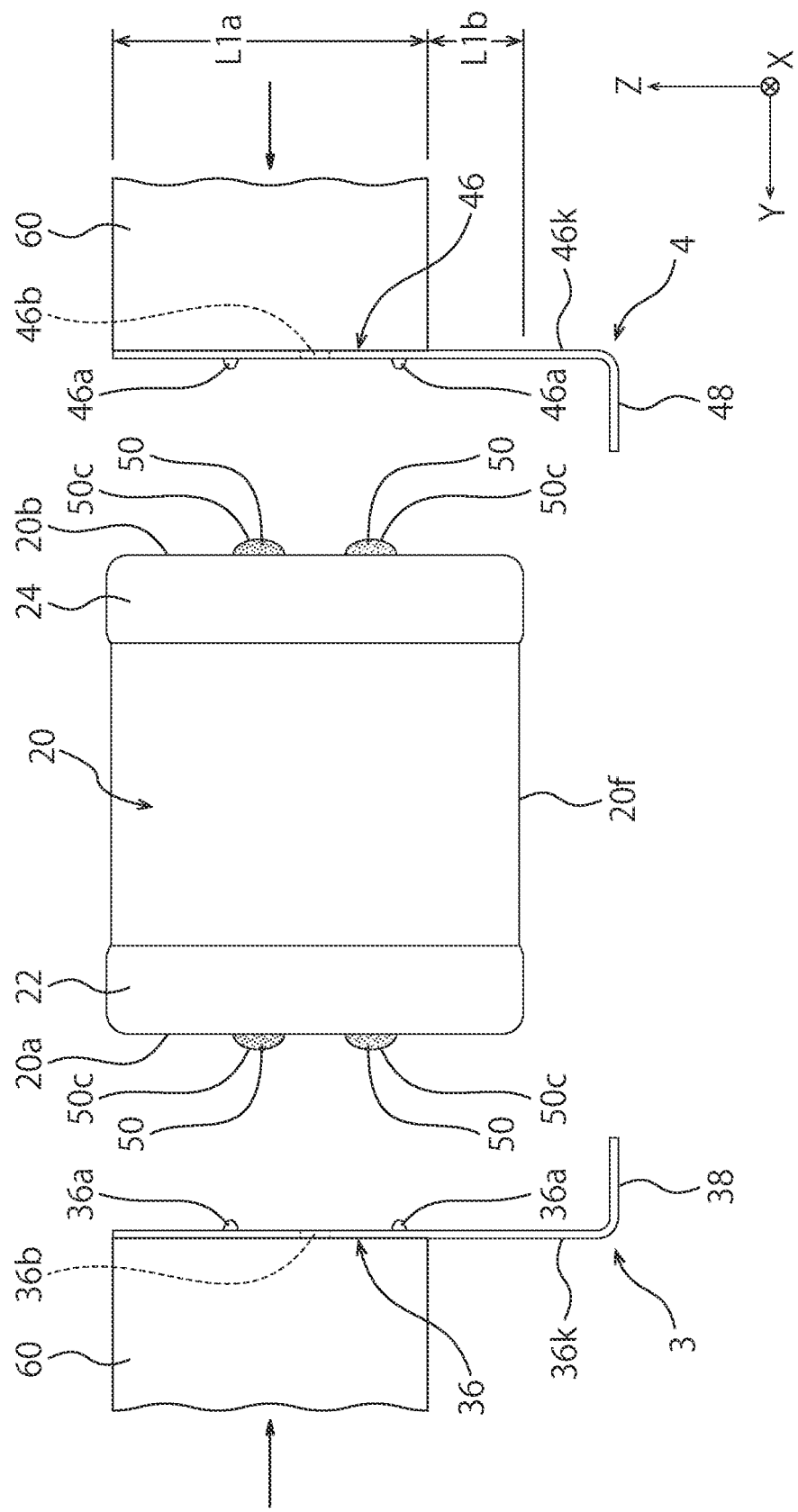
FIG. 2C is an exploded front view illustrating a method of manufacturing the ceramic electronic device shown in FIG. 2A.

As shown in FIG. 1B and FIG. 2B, the electrode facing portion 36 is provided with second through holes 36$c$ having a periphery portion connected with the lower arm portion 31$b$ or 33$b$, which is one of multiple pairs of the engagement arm portions 31$a$, 31$b$, 33$a$, and 33$b$. The second through holes 36$c$ are positioned closer to the mount portion 38 than the first through holes 36$b$. Unlike the first through holes 36$b$, the second through holes 36$c$ are not provided with any connection member, such as a solder. That is, the second through holes 36$c$ are formed in the non-joint region 50$b$.

The first terminal plate 30 with the second through holes 36$c$ has an easily deformable shape around the lower arm portions 31$b$ and 33$b$ supporting the capacitor chips 20 and can thereby effectively demonstrate a reduction effect on a stress generated in the capacitor 10 and an absorption effect on a vibration of the capacitor chips 20. Thus, the capacitor 10 having the first terminal plate 30 can favorably prevent an acoustic noise and have a favorable connection reliability with the mount board when being mounted.

The second through holes 36$c$ have any shape, but preferably have an opening width in the width direction, which is a parallel direction (X-axis direction) to the terminal second sides 36$ha$ and 36$hb$, that is wider than the first through holes 36$b$. When the second through holes 36$c$ have a wide opening width, the first terminal plate 30 can effectively enhance a reduction effect on stress and a prevention effect on acoustic noise. When the first through holes 36$b$ have an opening width that is smaller than the second through holes 36$c$, it is possible to prevent an excessive rise in connection strength between the capacitor chips 20 and the electrode facing portion 36 caused by excessive spreading of the connection member, and the capacitor 10 can thereby prevent an acoustic noise.

In the electrode facing portion 36, the second through hole 36$c$ connected with the lower arm portion 31$b$ is formed with a predetermined distance in the height direction against the terminal second side 36$hb$ connected with the mount portion 38, and a slit 36$d$ is formed between the second through hole 36$c$ and the terminal second side 36$hb$.

In the electrode facing portion 36, the slit 36$d$ is formed between a connection position of the lower arm portion 31$b$ positioned near the mount portion 38 with the electrode facing portion 36 (a lower side of a periphery portion of the second through hole 36$c$) and the terminal second side 36$hb$ connected with the mount portion 38. The slits 36$d$ extend in a parallel direction to the terminal second sides 36$ha$ and 36*hb*. The slits 36*d* can prevent a solder used at the time of mounting the capacitor 10 on a mount board from creeping up on the electrode facing portion 36 and prevent a formation of a solder bridge connected with the lower arm portions 31*b* and 33*b* or the first terminal electrodes 22. Thus, the capacitor 10 with the slits 36*d* demonstrates a prevention effect on acoustic noise.

As shown in FIG. 1 and FIG. 2, the engagement arm portions 31*a*, 31*b*, 33*a*, and 33*b* of the first terminal plate 30 extend from the electrode facing portion 36 to the third or fourth side surfaces 20*e* or 20*f*, which are chip side surfaces of the capacitor chips 20. The lower arm portion 31*b* (or lower arm portion 33*b*), which is one of the engagement arm portions 31*a*, 31*b*, 33*a*, and 33*b*, is formed by being bent from the lower periphery portion of the second through hole 36*c* in the Z-axis direction formed on the electrode facing portion 36.

The upper arm portion 31*a* (or upper arm portion 33*a*), which is another one of the engagement arm portions 31*a*, 31*b*, 33*a*, and 33*b*, is formed by being bent from the terminal second side 36*ha* at the upper part of the electrode facing portion 36 (positive side of the Z-axis direction).

The second through holes 36*c* are formed so that their periphery portions range the plate body part 36*j* and the terminal connection part 36*k*. The lower arm portions 31*b* and 33*b* extend from the terminal connection part 36*k*. That is, bases of the lower arm portions 31*b* and 33*b* are connected with lower sides of approximately rectangular periphery portions of the second through holes 36*c*.

The lower arm portions 31*b* and 33*b* extend from the bases toward inside in the Y-axis direction (toward the central parts of the chips 20) while being bent, touch the fourth side surfaces 20*f* of the capacitor chips 20, and support the capacitor chips 20 from below (see FIG. 2B). Incidentally, the lower arm portions 31*b* and 33*b* may tilt upward in the Z-axis direction from the lower sides of the periphery portions of the second through holes 36*c* before the chips 20 are attached. This is for enabling the lower arm portions 31*b* and 33*b* to touch the fourth side surfaces 20*f* of the chips 20 due to the resilience of the lower arm portions 31*b* and 33*b*.

Lower edges (chip second sides 20*h* below) of the first end surfaces 20*a* of the capacitor chips 20 are positioned slightly above the lower sides of the periphery portions of the second through holes 36*c*, which are the bases of the lower arm portions 31*b* and 33*b*. When viewing the capacitor chips 20 from the Y-axis direction as shown in FIG. 3A, the lower edges (chip second sides 20*h* below) of the first end surfaces 20*a* of the capacitor chips 20 can be recognized from the side of the capacitor 10 via the second through holes 36*b*.

As shown in FIG. 1B, a pair of upper arm portion 31*a* and lower arm portion 31*b* holds one capacitor chip 20, and a pair of upper arm portion 33*a* and lower arm portion 33*b* holds another one capacitor chip 20. Since a pair of upper arm portion 31*a* and lower arm portion 31*b* (or upper arm portion 33*a* and lower arm portion 33*b*) holds one capacitor chip 20, not multiple capacitor chips 20, the first terminal plate 30 can definitely hold each of the capacitor chips 20.

The pair of upper arm portion 31*a* and lower arm portion 31*b* does not hold the capacitor chip 20 from both ends of the chip second sides 20*h*, which are shorter sides of the first end surface 20*a*, but holds the capacitor chip 20 from both ends of the chip first sides 20*g*, which are longer sides of the first end surface 20*a*. This increases distances between the upper arm portions 31*a* and 33*a* and the lower arm portions 31*b* and 33*b*, and easily absorbs a vibration of the capacitor chips 20. Thus, the capacitor 10 can favorably prevent an acoustic noise.

Incidentally, a pair of upper arm portion 31*a* and lower arm portion 31*b* holding the capacitor chip 20 may have mutually asymmetry shapes and mutually different lengths in the width direction (lengths in the X-axis direction). Since the lower arm portions 31*b* and 33*b* extend from the terminal connection part 36*k*, the capacitor chips 20 have a short transmission path between the first terminal electrodes 22 and the mount board, compared to when the lower arm portions 31*b* and 33*b* are connected with the plate body part 36*j*.

As shown in FIG. 1B and FIG. 2B, the second terminal plate 40 has an electrode facing portion 46, a plurality of pairs of engagement arm portions 41*a*, 41*b*, 43*a*, and 43*b*, and a mount portion 48. The electrode facing portion 46 faces the second terminal electrodes 24. The engagement arm portions 41*a*, 41*b*, 43*a*, and 43*b* sandwich and hold the capacitor chips 20 from both ends of the chip first sides 20*g* in the Z-axis direction. The mount portion 48 extends from the electrode facing portion 46 toward the capacitor chips 20 and is at least partially approximately perpendicular to the electrode facing portion 46.

As is the case with the electrode facing portion 36 of the first terminal plate 30, the electrode facing portion 46 of the second terminal plate 40 has a pair of terminal first sides 46*g* approximately parallel to the chip first sides 20*g* and a terminal second side 46*ha* approximately parallel to the chip second sides 20*h*. The electrode facing portion 46 is provided with protrusions (not illustrated), first through holes (not illustrated), second through holes (not illustrated), and slits 46*d* (see FIG. 6), all of which are similar to the protrusions 36*a*, the first through holes 36*b*, the second through holes 36*c*, and the slits 36*d* formed on the electrode facing portion 36.

As shown in FIG. 1B, the second terminal plate 40 is arranged symmetrically to the first terminal plate 30 and is different from the first terminal plate 30 in arrangement against the capacitor chips 20. The second terminal plate 40 is, however, different from the first terminal plate 30 only in arrangement against the capacitor chips 20 and has a similar shape to the first terminal plate 30. Thus, the second terminal plate 40 is not described in detail.

The method of manufacturing the capacitor 10 according to the present embodiment is similar to the method of manufacturing the capacitor 1 according to First Embodiment, but is different therefrom in the following matters as the terminal plates 30 and 40 are respectively provided with the second through holes 36*c* (see FIG. 1B) and 46*c* (see FIG. 6) in the present embodiment. That is, it is preferred in the present embodiment that the press head 60 shown in FIG. 2C contact with a part of the outer surface of the terminal plate 30 (40) in the Z-axis direction that is above the second through holes 36*c* (46*c*) (near anti-mounting surface).

Incidentally, the lower end of the press head 60 in the Z-axis direction may be located at a position where the press head 60 covers the second through holes 36*c* (46*c*) on the outer surface of the terminal plate 30 (40), but is preferably located above the lower arm portions 31*b* and 33*b* (41*b* and 43*b*) shown in FIG. 2B.

In the method according to the present embodiment, the connection member 50 applied in the initial application regions 50*c* is spread out by heating and pressing of the press head 60, and the joint regions 50*a* are also formed. The non-joint region 50*b* is a region where the connection member 50 is not spread out. This allows the first and second terminal plates 30 and 40 to be electrically and mechanically connected with the first and second terminal electrodes 22 and 24 of the capacitor chips 20. Then, the capacitor 10 is obtained.

In the present embodiment, the press head 60 contacts with the outer surface of the terminal plate 30 (40) and heats and presses it, and a region with the first surface roughness is formed in the region having length L1a shown in FIG. 2C. In the region having length L1b shown in FIG. 2C, the press head 60 shown in FIG. 2C does not contact, and a region with the second surface roughness is formed on the outer surface of the terminal plate 30 (40). The region with the second surface roughness continues to the outer surface of the intermediate connection part 36k (46k) and the outer surface of the mounting portion 38 (48). In the present embodiment, the outer surface with the second surface roughness is an outer surface of the electrode facing portion 36 (46) from a position where the second through holes 36c (46c) are formed to the vicinity of the mount portion 38 (48).

In the capacitor 10, a plurality of capacitor chips 20 is arranged side by side in the parallel direction to the mount surface. In the capacitor 10, for example, only one capacitor chip 20 is held in the engagement direction (Z-axis direction) between a pair of engagement arm portions 31a and 31b. Thus, the capacitor 10 has a high connection reliability between the capacitor chip 20 and the terminal plates 30 and 40, and has a high reliability for impact and vibration.

Moreover, since a plurality of capacitor chips 20 is arranged and laminated in the parallel direction to the mount surface, the capacitor 10 has a short transmission path and can achieve a low ESL. Since the capacitor chips 20 are held perpendicularly to the lamination direction of the capacitor chips 20, the first and second terminal plates 30 and 40 can hold the capacitor chips 20 without any problems even if the length L2 of the chip second side 20h of the capacitor chips 20 varies due to change in the lamination number of the capacitor chips 20 to be held. Since the first and second terminal plates 30 and 40 can hold the capacitor chips 20 having various lamination numbers, the capacitor 10 can flexibly respond to design change.

In the capacitor 10, the upper arm portions 31a and 33a and the lower arm portions 31b and 33b sandwich and hold the capacitor chips 20 from both ends of the chip first sides 20g, which are longer sides of the first end surfaces 20a of the capacitor chips 20. Thus, the first and second terminal plates 30 and 40 can effectively demonstrate a restraint effect on stress, prevent a transmission of vibration from the capacitor chips 20 to the mount board, and prevent an acoustic noise.

In particular, since the lower arm portions 31b and 33b are connected with the peripheries of the second through holes 36c, the lower arm portions 31b and 33b supporting the capacitor chips 20 and the electrode facing portions 36 and 46 supporting the lower arm portions 31b and 33b have elastically deformable shapes. Thus, the first and second terminal plates 30 and 40 can effectively demonstrate a restraint effect on a stress generated in the capacitor 10 and a vibration absorption effect.

Figure 5:
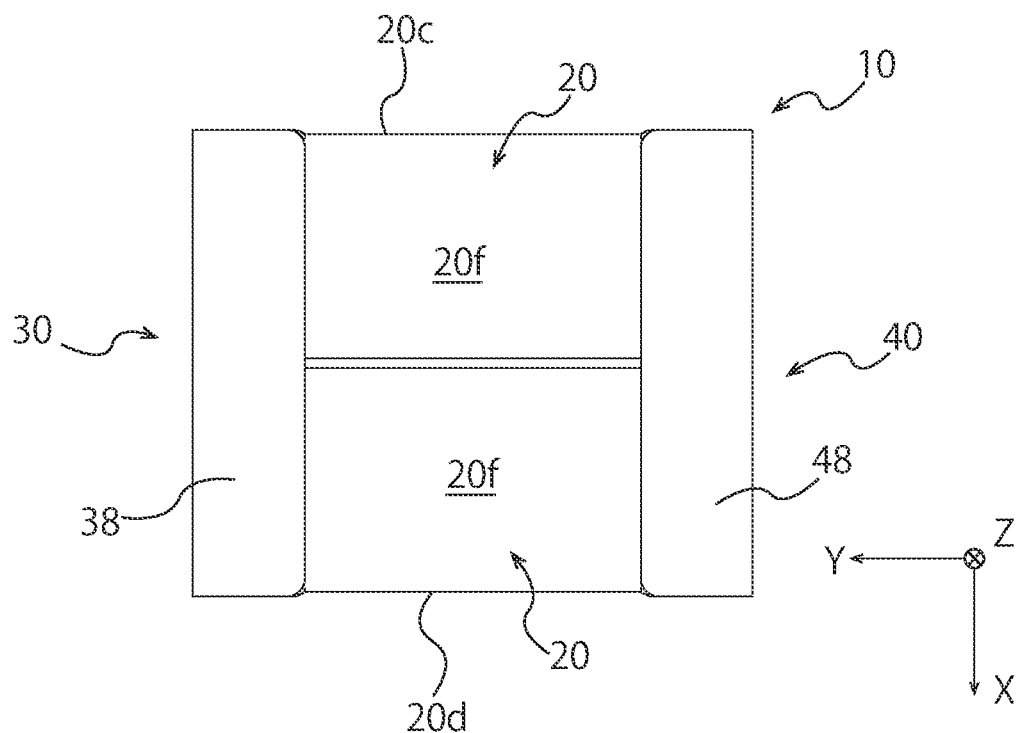
FIG. 5 is a bottom view of the ceramic electronic device shown in FIG. 1B.

Since the lower arm portions 31b and 33b are connected with the peripheries of the second through holes 36c, the capacitor 10 can arrange the lower arm portions 31b and 33b at overlapped positions with the mount portion 38 when viewed from the perpendicular direction (Z-axis direction) to the mount surface (see FIG. 2 and FIG. 5). Thus, the capacitor 10 can have a wide mount portion 38 and is advantageous in downsizing.

In the capacitor 10 according to the present embodiment, a pair of engagement arm portions (elastic holding portions) 31a, 31b, 33a, and 33b (the same applies to 41a, 41b, 43a, and 43b) of the terminal plate 30 (the same applies to the terminal plate 40) particularly sandwich and hold the chips 20 from both sides in the Z-axis direction. In addition, the connection member 50 (see FIG. 2), such as a solder, connects between the terminal plates 30 and 40 and the chips 20 within a predetermined range of the joint regions 50a, and the chips 20 and the terminal plates 30 and 40 can be joined definitely and firmly.

The non-joint region 50b, which does not connect between the electrode facing portion 36 (46) and the end surfaces of the terminal electrodes 22 (24), is formed between the peripheries of the joint regions 50a and the engagement arm portions 31a, 31b, 33a, and 33b (the same applies to 41a, 41b, 43a, and 43b). In the non-joint region 50b, the electrode facing portion 36 (46) of the terminal plate 30 (40) can freely elastically be deformed without being disturbed by the terminal electrodes 22 (24), and stress is reduced. This favorably maintains an elastic property of the engagement arm portions 31a, 31b, 33a, and 33b (41a, 41b, 43a, and 43b) continuing to the non-joint region 50b, and the chips 20 can favorably be held between a pair of engagement arm portions 31a and 31b and between a pair of engagement arm portions 33a and 33b. In addition, the terminal plate 30 (40) is easily elastically deformed, and an acoustic noise phenomenon can be prevented effectively.

Moreover, in the present embodiment, the electrode facing portion 36 (46) is provided with the second through holes 36c going through the front and rear surfaces of the electrode facing portion 36 (46) in the non-joint region 50b. The arm portions 31a and 33b (41b and 43b) extend from the opening peripheries of the second through holes 36c. Since the second through holes 36c are formed, the non-joint region 50b can be formed easily, the arm portions 31a and 33b (41b and 43b) can be formed easily, and the chips 20 are held firmly.

Third Embodiment

Figure 7:
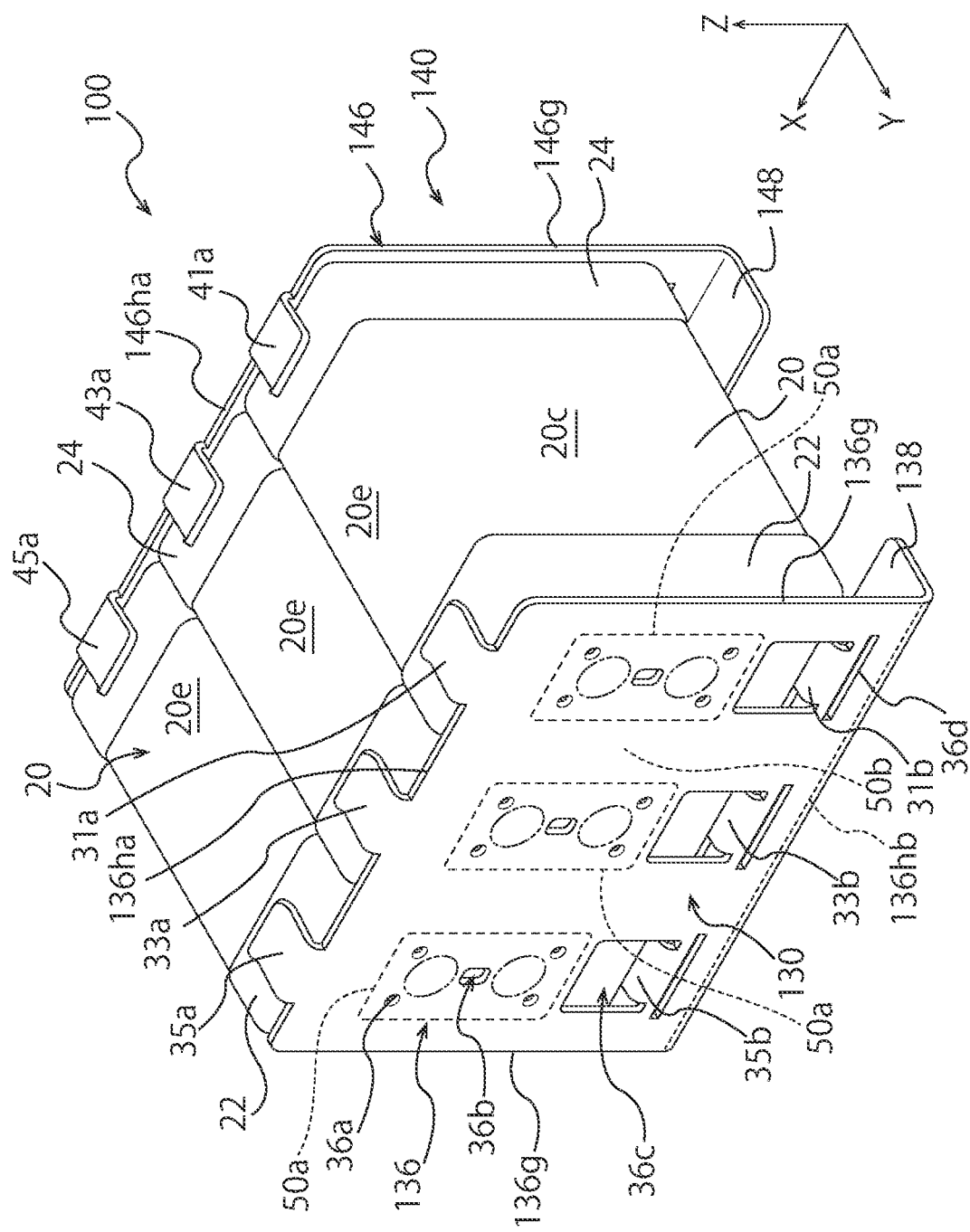
FIG. 7 is a schematic perspective view illustrating a ceramic electronic device according to Second Embodiment of the present invention.

FIG. 7 is a schematic perspective view of a capacitor 100 according to Third Embodiment of the present invention. FIG. 8 to FIG. 11 are respectively a front view, a left-side view, a top view, and a bottom view of the capacitor 100. As shown in FIG. 7, the capacitor 100 is similar to the capacitor 10 according to Second Embodiment except that the capacitor 100 has three capacitor chips 20 and a different number of first through holes 36b or so contained in a first terminal plate 130 and a second terminal plate 140. In the description of the capacitor 100, similar parts to the capacitor 10 are provided with similar references to the capacitor 10 and are not described.

Figure 8:
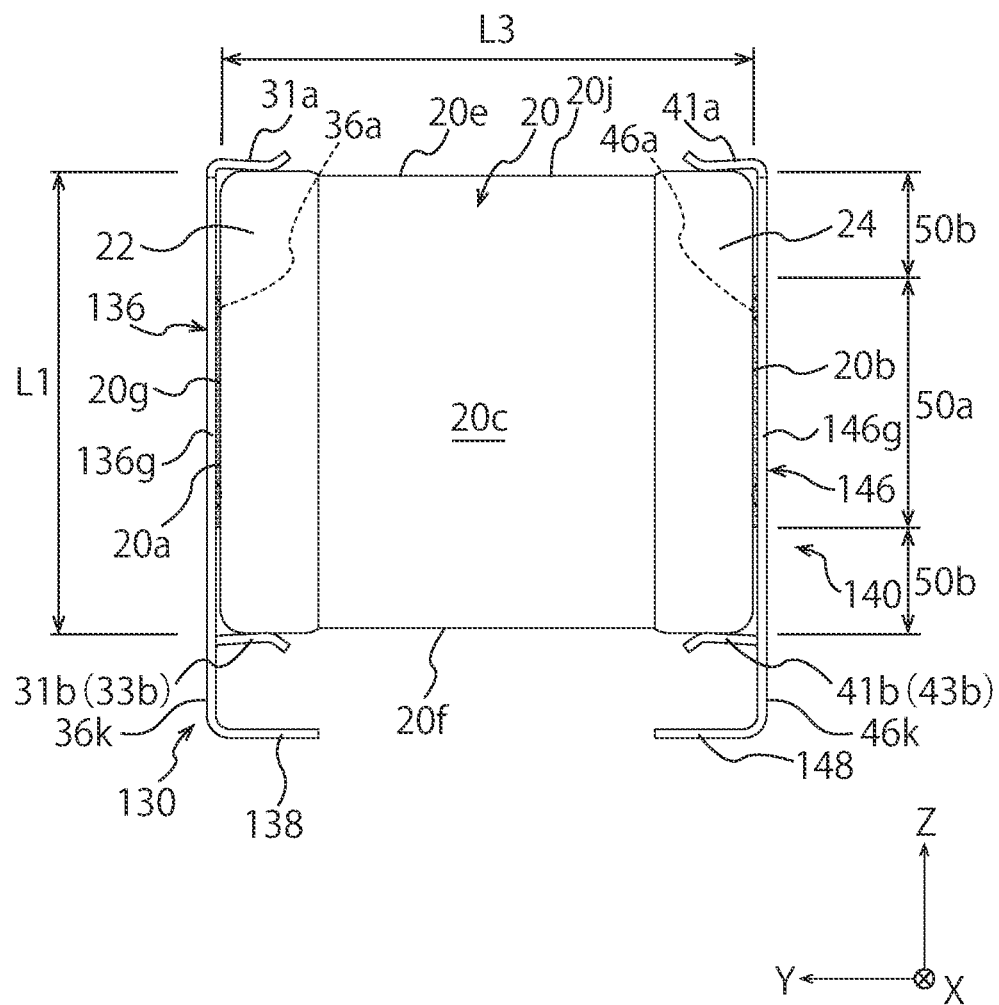
FIG. 8 is a front view of the ceramic electronic device shown in FIG. 7.
Figure 10:
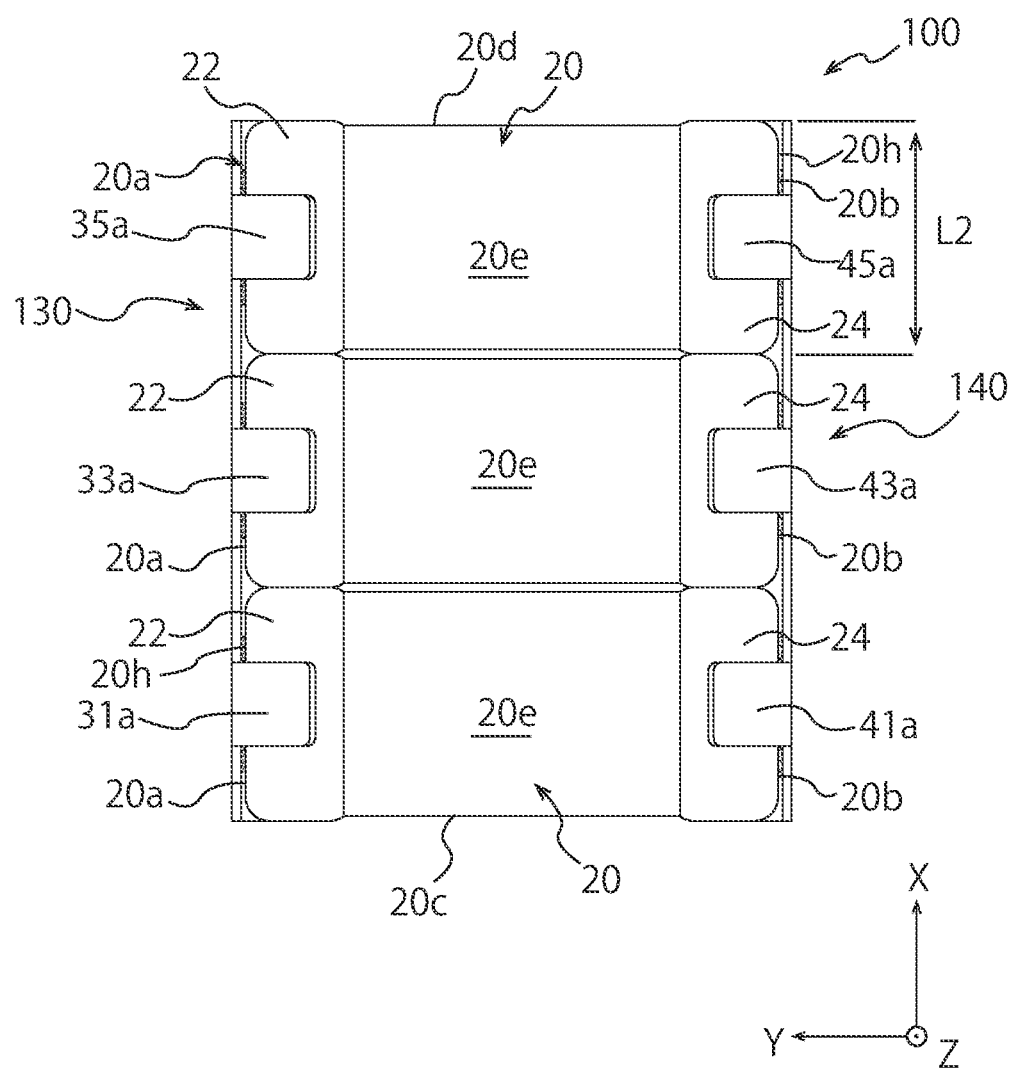
FIG. 10 is a top view of the ceramic electronic device shown in FIG. 7.

As shown in FIG. 7, the capacitor chips 20 contained in the capacitor 100 are similar to the capacitor chips 20 contained in the capacitor 10 shown in FIG. 1B. The three capacitor chips 20 contained in the capacitor 100 are arranged so that chip first sides 20g are perpendicular to a mount surface as shown in FIG. 8, and that chip second sides 20h are parallel to a mount surface as shown in FIG. 10. The three capacitor chips 20 contained in the capacitor 100 are arranged in parallel to a mount surface so that the first terminal electrodes 22 of the capacitor chips 20 adjacent to each other are mutually in contact with, and that the second terminal electrodes 24 of the capacitor chips 20 adjacent to each other are mutually in contact with.

The first terminal plate 130 contained in the capacitor 100 has an electrode facing portion 136, three pairs of engagement arm portions 31a, 31b, 33a, 33b, 35a, and 35b, and a mount portion 138. The electrode facing portion 136 faces the first terminal electrodes 22. The three pairs of engagement arm portions 31a, 31b, 33a, 33b, 35a, and 35b hold the capacitor chips 20. The mount portion 138 is bent perpendicularly from a terminal second side 136hb of the electrode facing portion 136 toward the capacitor chips 20. The electrode facing portion 136 has a substantially rectangular flat shape, and has a pair of terminal first sides 136g approximately parallel to the chip first sides 20g and a pair of terminal second sides 136ha and 136hb approximately parallel to the chip second sides 20h.

Figure 9:
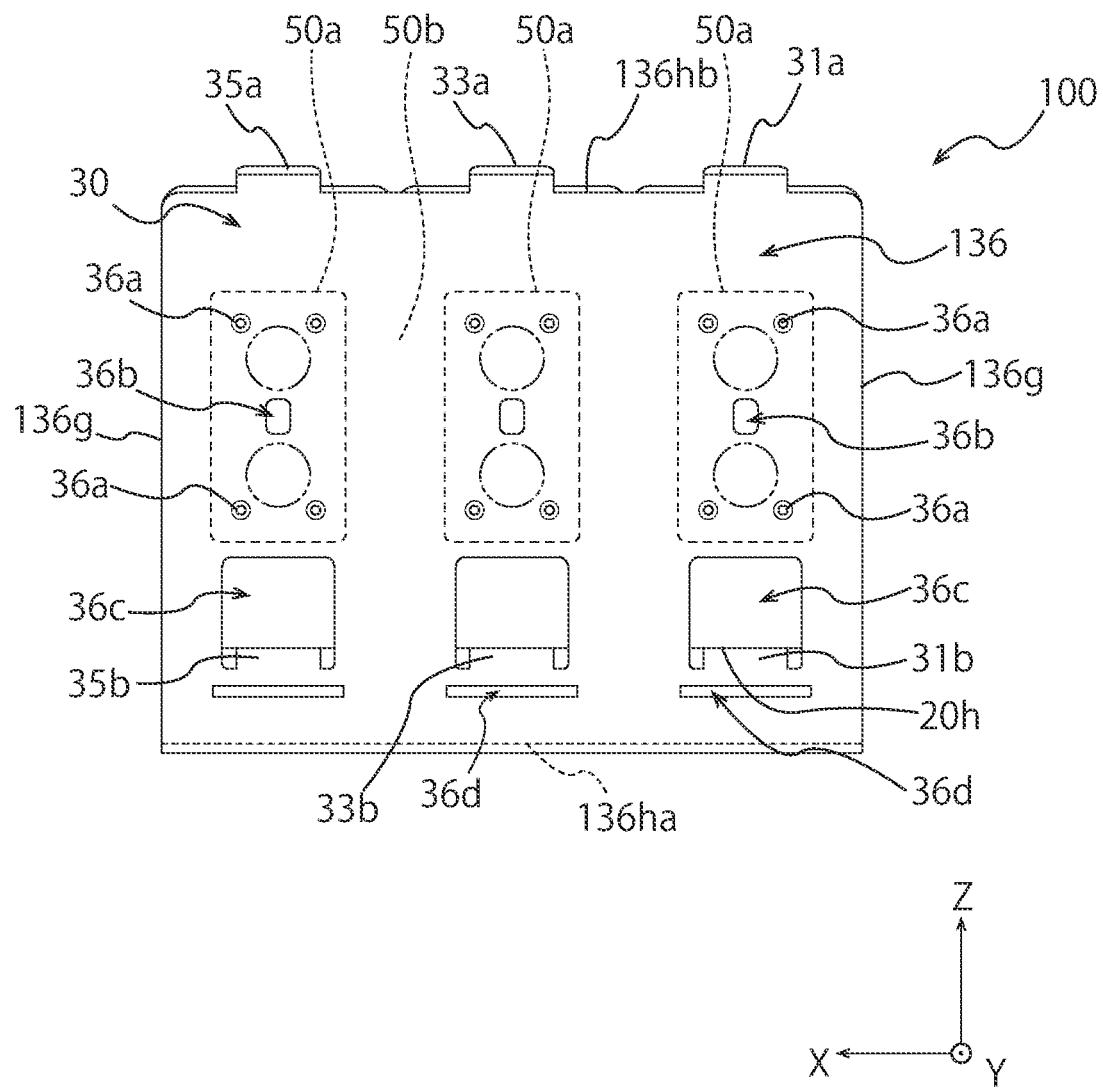
FIG. 9 is a left-side view of the ceramic electronic device shown in FIG. 7.

As is the case with the first terminal plate 3 shown in FIG. 3A, the first terminal plate 130 is provided with the protrusions 36a, the first through holes 36b, the second through holes 36c, and the slits 36d as shown in FIG. 9. The first terminal plate 130 is, however, provided with three first through holes 36b, three second through holes 36c, and three slits 36d, and one first through hole 36b, one second through hole 36c, and one slit 36d correspond with one capacitor chip 20. The first terminal plate 130 is provided with 12 protrusions 36a in total, and the four protrusions 36a correspond with each of the capacitor chips 20.

In the first terminal plate 130, as shown in FIG. 10, the upper arm portion 31a and the lower arm portion 31b hold one of the capacitor chips 20, the upper arm portion 33a and the lower arm portion 33b hold another one of the capacitor chips 20, and the upper arm portion 35a and the lower arm portion 35b hold another one of the capacitor chips 20 that is different from the above two capacitor chips 20. The upper arm portions 31a, 33a, and 35a are connected with the terminal second side 136ha at the upper part of the electrode facing portion 136 (positive side of the Z-axis direction), and the lower arm portions 31b, 33b, and 35b are connected with periphery portions of the second through holes 36c.

Figure 11:
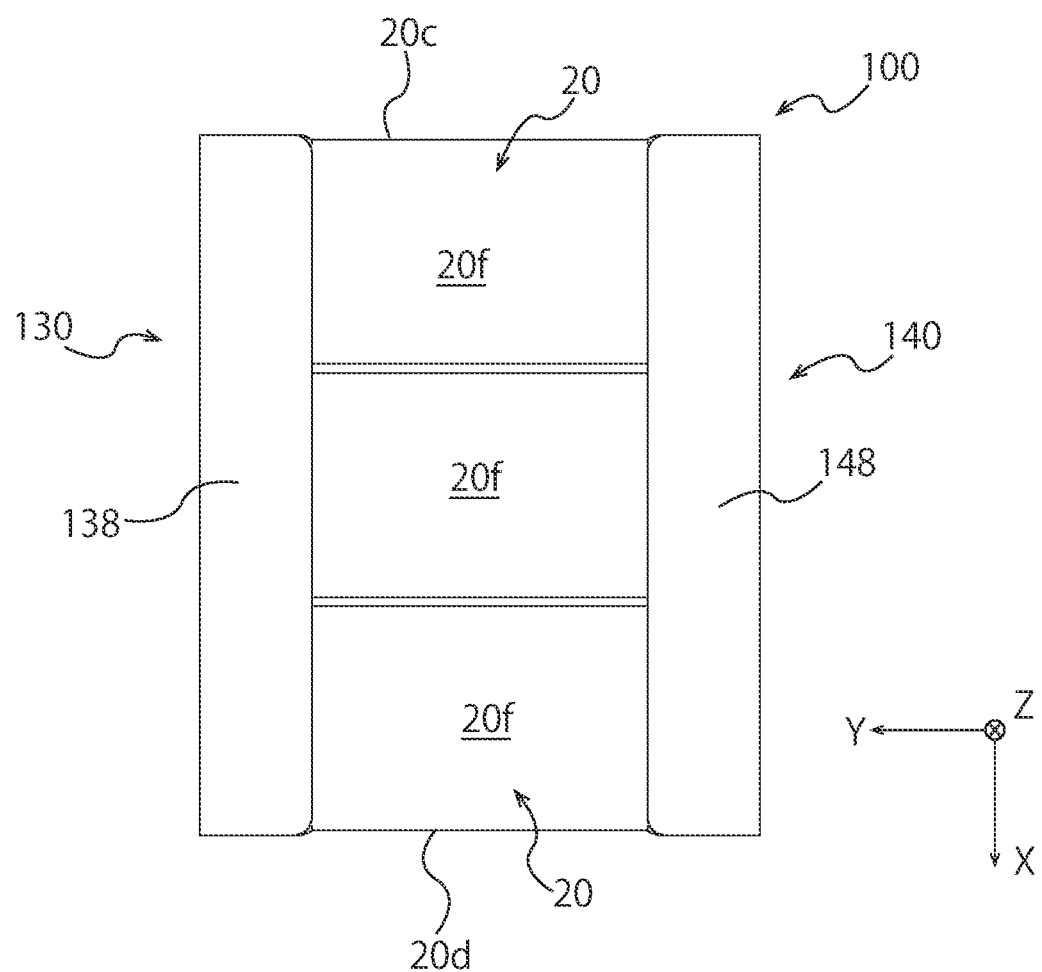
FIG. 11 is a bottom view of the ceramic electronic device shown in FIG. 7.

As shown in FIG. 8 and FIG. 11, the mount portion 138 of the first terminal plate 130 is connected with the terminal second side 136hb at the lower part of the electrode facing portion 136 (negative side of the Z-axis direction). The mount portion 138 extends from the terminal second side 136hb toward the capacitor chips 20 (negative side of the Y-axis direction) and is bent approximately perpendicularly to the electrode facing portion 136.

The second terminal plate 140 has an electrode facing portion 146, a plurality of pairs of engagement arm portions 41a, 43a, and 45a, and a mount portion 148. The electrode facing portion 146 faces the second terminal electrodes 24. The engagement arm portions 41a, 43a, and 45a sandwich and hold the capacitor chips 20 from both ends of the chip first sides 20g in the Z-axis direction. The mount portion 148 extends from the electrode facing portion 146 toward the capacitor chips 20 and is at least partially approximately perpendicular to the electrode facing portion 146.

As is the case with the electrode facing portion 136 of the first terminal plate 130, the electrode facing portion 146 of the second terminal plate 140 has a pair of terminal first sides 146g approximately parallel to the chip first sides 20g and a terminal second side 146ha approximately parallel to the chip second sides 20h, and the electrode facing portion 146 is provided with the protrusions 46a, first through holes, second through holes, and slits. As shown in FIG. 7, the second terminal plate 140 is arranged symmetrically to the first terminal plate 130 and is different from the first terminal plate 130 in arrangement to the capacitor chips 20. The second terminal plate 140 is, however, different from the first terminal plate 130 only in arrangement and has a similar shape to the first terminal plate 130. Thus, the second terminal plate 140 is not described in detail.

The capacitor 100 according to Third Embodiment has similar effects to those of the capacitor 10 according to Second Embodiment. Incidentally, the number of the upper arm portions 31a to 35a, the lower arm portions 31b to 35b, the first through holes 36b, the second through holes 36c, and the slits 36d contained in the first terminal plate 130 of the capacitor 100 is the same as the number of the capacitor chips 20 contained in the capacitor 100, but the number of the engagement arm portions or so contained in the capacitor 100 is not limited thereto. For example, the first terminal plate 130 may be provided with twice as many first through holes 36b as the capacitor chips 20, or may be provided with a single continuous long slit 36d.

Other Embodiments

Incidentally, the present invention is not limited to the above-mentioned embodiments, and may variously be changed within the scope of the present invention.

For example, the first terminal plate 3 shown in FIG. 1A has the protrusions 36a and the first through holes 36b, but the first terminal plate of the present invention is not limited to the first terminal plate 3 shown in FIG. 1 and may be a variation that does not have one or more of these components. Moreover, the capacitor of Second Embodiment has a pair of arm portions (e.g., 31a and 31b) in the Z-axis direction, but the capacitor of the present invention may not have one of arm portions (e.g., 31a) positioned above in the Z-axis direction and have only the other arm portion (e.g., 31b).

Figure 3C:
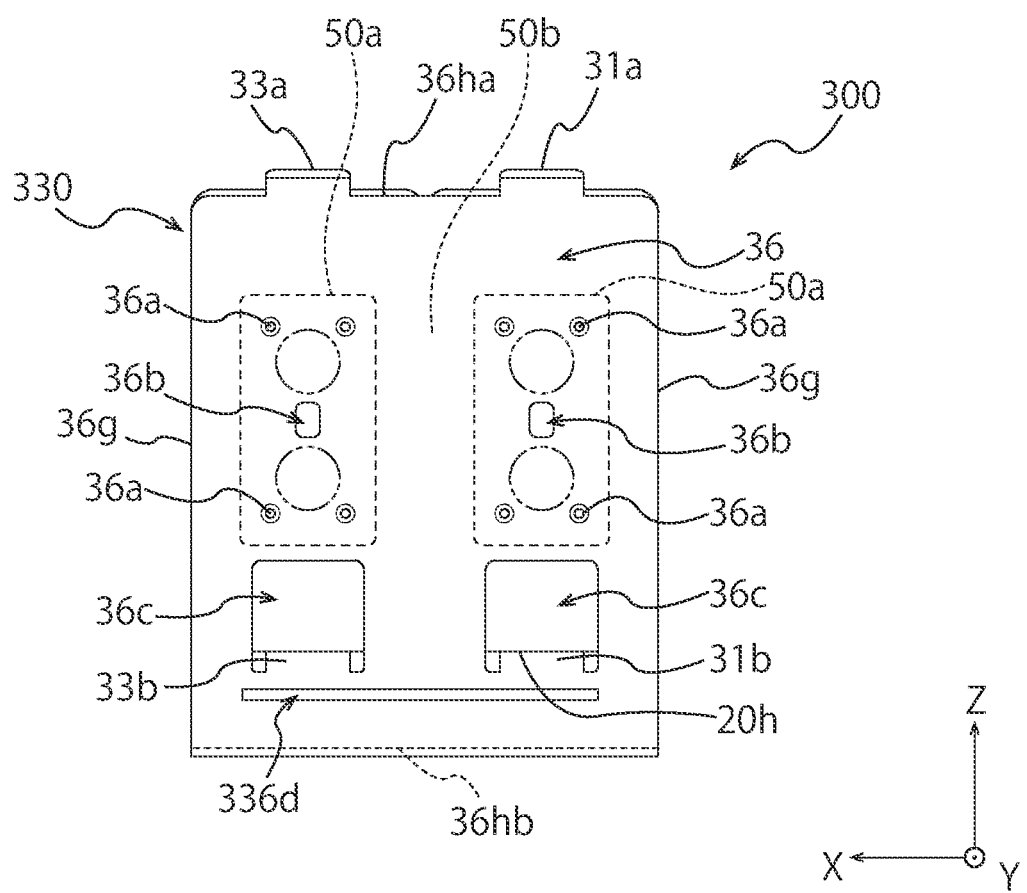
FIG. 3C is a left-side view of a ceramic electronic device according to another variation of FIG. 3A.

FIG. 3C is a left-side view illustrating a capacitor 300 according to Second Variation of the present invention. The capacitor 300 according to Second Variation is similar to the capacitor 10 according to Second Embodiment except for the shape of slits 336d formed on first and second terminal plates 330. As shown in FIG. 3C, the first and second terminal plates 330 are provided with a single slit 336d formed below two second through holes 36c and continuing in the X-axis direction. The slit 336d has any shape and number as long as the slit 336d is formed between lower edges (chip second sides 20h) of the capacitor chips 20 facing the first end surfaces 20a and the terminal second side 36hb (i.e., intermediate connection part 36k).

Figure 12:
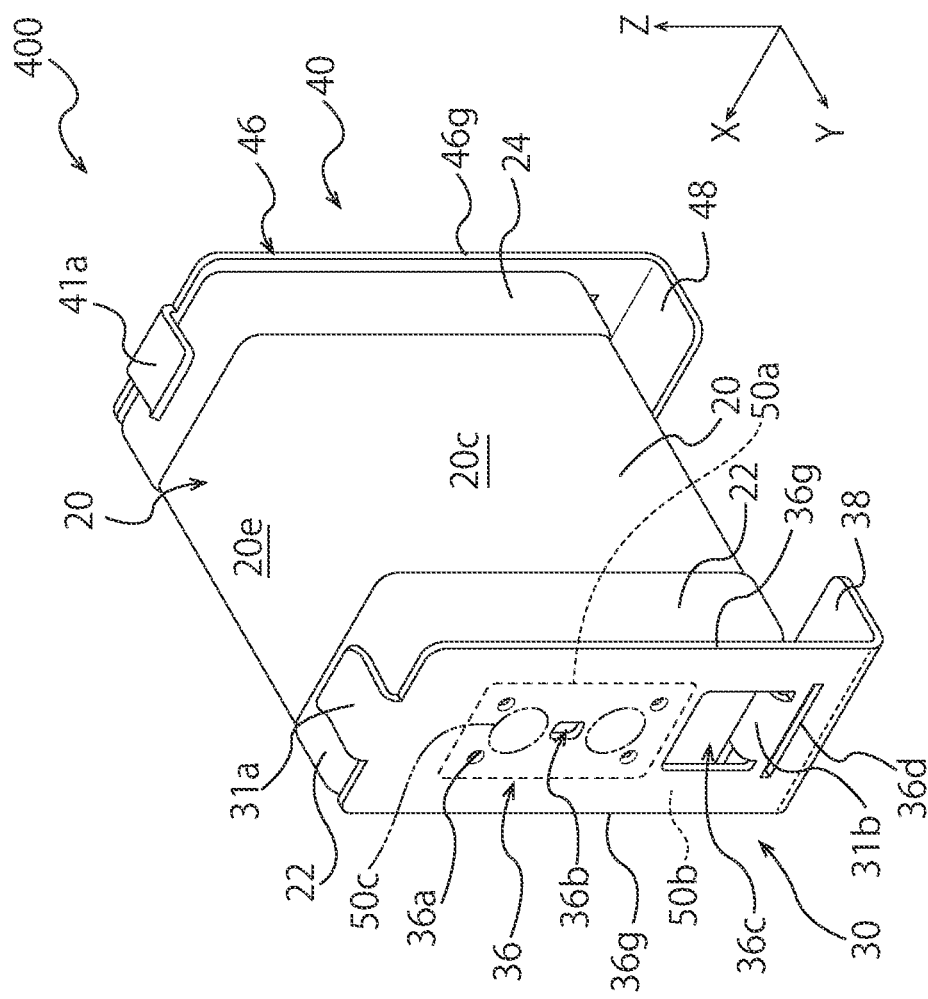
FIG. 12 is a schematic perspective view illustrating a ceramic electronic device according to a variation of the embodiment shown in FIG. 1.
Figure 13:
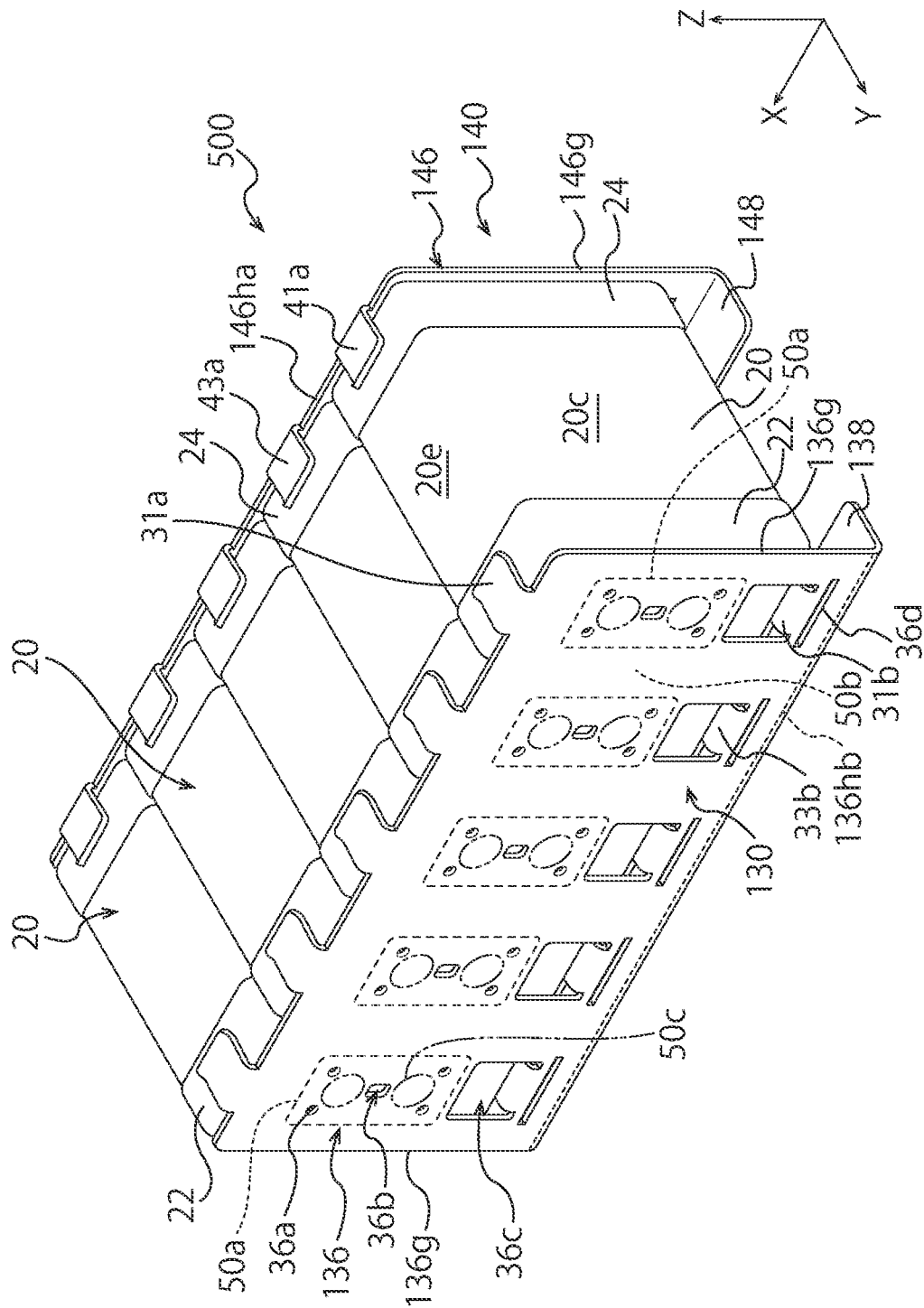
FIG. 13 is a schematic perspective view illustrating a ceramic electronic device according to a variation of the embodiment shown in FIG. 7.
Figure 14:
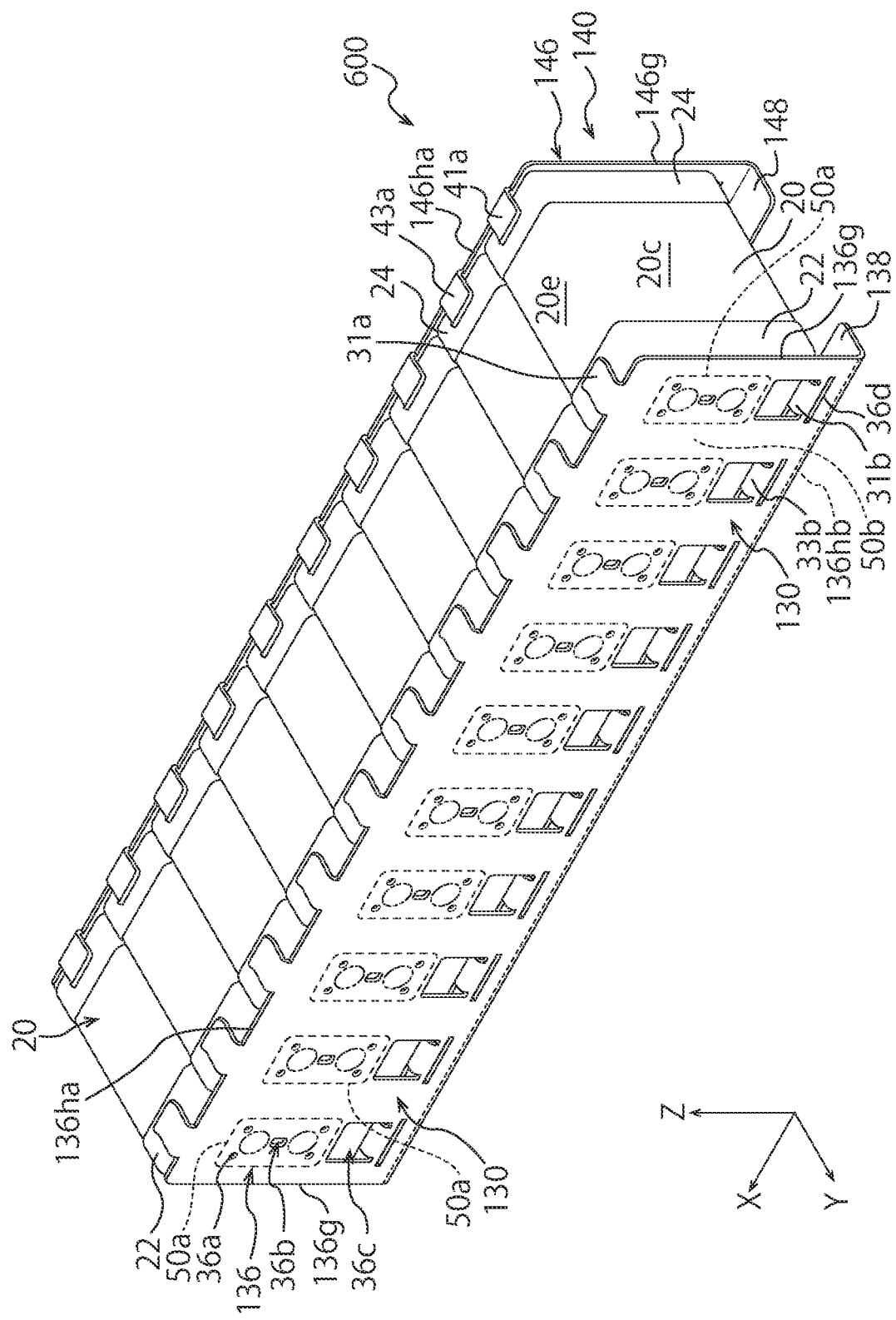
FIG. 14 is a schematic perspective view illustrating a ceramic electronic device according to a variation of the embodiment shown in FIG. 13.

In the present invention, the number of chips owned by the electronic device may be singular or any plural. For example, the metal terminals 30 and 40 of the capacitor 400 shown in FIG. 12 hold a single capacitor chip 20. For example, the metal terminals 130 and 140 of the capacitor 500 shown in FIG. 13 hold five capacitor chips 20 in the X-axis direction. In the capacitor 600 shown in FIG. 14, the metal terminals 130 and 140 hold 10 capacitor chips 20 in the X-axis direction.

NUMERICAL REFERENCES 1, 10, 100, 200, 300, 400, 500, 600 . . . capacitor
3, 4, 30, 130, 40, 140 . . . terminal plate
20 . . . capacitor chip
20a . . . first end surface
20b . . . second end surface
20c . . . first side surface
20d . . . second side surface
20e . . . third side surface
20f . . . fourth side surface 20g . . . chip first side
20h . . . chip second side
20j . . . chip third side
22 . . . first terminal electrode
24 . . . second terminal electrode
26 . . . internal electrode layer
28 . . . dielectric layer
31a, 33a, 35a, 41a, 43a, 45a . . . upper arm portion (holding portion)
31b, 33b, 35b, 41b, 43b . . . lower arm portion (holding portion)
36, 136, 46, 146 . . . electrode facing portion (terminal body)
36a, 46a . . . protrusion
36b . . . first through hole
36c . . . second through hole
36d, 46d . . . slit
36g . . . terminal first side
36ha, 36hb . . . terminal second side
38, 138, 48, 148 . . . mount portion
50 . . . connection member
50a . . . joint region
50b . . . non-joint region
50c . . . initial application region

The invention claimed is:

1. An electronic device, comprising:
a chip component; and
a terminal plate connected to the chip component, wherein:
an outer surface of the terminal plate comprises:
  a first surface roughness region having a first surface roughness; and
  a second surface roughness region having a second surface roughness (1) that is larger than the first surface roughness and (2) resulting from a contact of a heated press head that causes a change in surface roughness; and
the first surface roughness and second surface roughness are measurable by a surface roughness standard.

2. The electronic device according to claim 1, further comprising a connection member that connects the chip component and the terminal plate; wherein:
the terminal plate comprises:
  a terminal body disposed correspondingly with an end surface of a terminal electrode of the chip component; and
  a mount portion continuously formed from the terminal body and configured for connection to a mounting surface,
the connection member is in a predetermined range between the end surface of the terminal electrode and an inner surface of the terminal body;
the terminal body includes (a) a joint region at which the terminal body is connected to the end surface of the terminal electrode and (b) a non-joint region (1) at which the terminal body is not connected to the end surface of the terminal electrode and (2) between a periphery of the joint region and the mount portion;
the second surface roughness region is on the outer surface of the terminal body corresponding with the joint region; and
the first surface roughness region is on the outer surface of the terminal body corresponding with the non-joint region located near the mount portion.

3. The electronic device according to claim 2, wherein a first through hole going through front and rear surfaces is formed on the terminal body of the terminal plate corresponding with the joint region.

4. The electronic device according to claim 2, wherein:
a second through hole going through front and rear surfaces is formed on the terminal plate;
a holding portion extends from an opening edge of the second through hole and supports a side surface of the chip component near the mounting surface; and
the first surface roughness region ranges from a position where the second through hole is formed to a vicinity of the mount portion on the outer surface of the terminal body.

5. The electronic device according to claim 3, wherein:
a second through hole going through front and rear surfaces is formed on the terminal plate;
a holding portion extends from an opening edge of the second through hole and supports a side surface of the chip component near the mounting surface; and
the first surface roughness region ranges from a position where the second through hole is formed to a vicinity of the mount portion on the outer surface of the terminal body.

6. An electronic device, comprising:
chip components; and
a terminal plate (1) connected to the chip components and (2) that includes a mount portion that is configured for connection to a mounting surface, wherein:
an outer surface of the terminal plate comprises:
  a first surface roughness region having a first surface roughness; and
  a second surface roughness region having a second surface roughness (1) that is larger than the first surface roughness, and (2) resulting from a contact of a heated press head that causes a change in surface roughness; and
the chip components are arranged in parallel to the mounting surface.

7. An electronic device, comprising:
a chip component;
a terminal plate; and
a connection member that connects the chip component and the terminal plate;
wherein:
the terminal plate comprises:
  a terminal body located at an end surface of a terminal electrode of the chip component; and
  a mount portion continuously formed from the terminal body and configured for connection to a mounting surface,
the connection member is in a predetermined range between the end surface of the terminal electrode and an inner surface of the terminal body;
the terminal body includes (a) a joint region at which the terminal body is connected to the end surface of the terminal electrode and (b) a non-joint region (1) at which the terminal body is not connected to the end surface of the terminal electrode and (2) between a periphery of the joint region and the mount portion;
an outer surface of the terminal body comprises:
  a first surface roughness region having a first surface roughness; and
  a second surface roughness region having a second surface roughness that is larger than the first surface roughness;
the second surface roughness region is on the outer surface of the terminal body corresponding with the joint region; and the first surface roughness region is on the outer surface of the terminal body corresponding with the non-joint region located near the mount portion.

8. An electronic device, comprising:

a chip component; and a terminal plate connected to the chip component, wherein:

the terminal plate comprises:

a terminal body located at an end surface of a terminal electrode of the chip component; and a mount portion continuously formed from the terminal body and configured for connection to a mounting surface;

the terminal body comprises:

a first through hole extending through front and rear surfaces; and a second through hole extending through the front and rear surfaces and positioned closer to the mount portion than the first through hole, the end surface of the terminal electrode and the terminal body are joined by a connection member at a periphery of the first through hole;

the second through hole is in a non-joint region at which there is space between the end surface of the terminal electrode and the terminal body;

an outer surface of the terminal body comprises:

a first surface roughness region having a first surface roughness; and a second surface roughness region having a second surface roughness that is larger than the first surface roughness;

the second surface roughness region is at a periphery of the first through hole; and the first surface roughness region is at a periphery of the second through hole.

\* \* \* \* \*